(12) United States Patent
Montgomery et al.

(10) Patent No.: US 7,847,562 B2
(45) Date of Patent: Dec. 7, 2010

(54) METHOD AND APPARATUS FOR DETECTION OF RESISTIVE FAULT CONDITIONS

(75) Inventors: Steven R. Montgomery, Kitchener (CA); Nicolas Jones, Kitchener (CA)

(73) Assignee: 2D2C, Inc., Gurnee, IL (US)

( * ) Notice: Subject to any disclaimer, the term of this patent is extended or adjusted under 35 U.S.C. 154(b) by 61 days.

(21) Appl. No.: 11/756,181

(22) Filed: May 31, 2007

(65) Prior Publication Data

US 2008/0122447 A1 May 29, 2008

Related U.S. Application Data

(60) Provisional application No. 60/867,674, filed on Nov. 29, 2006.

(51) Int. Cl.
*G01R 31/02* (2006.01)
(52) U.S. Cl. ............. 324/542; 361/42; 361/45; 361/115
(58) Field of Classification Search ............. 324/542
See application file for complete search history.

(56) References Cited

U.S. PATENT DOCUMENTS

| | | | | |
|---|---|---|---|---|
| 4,378,579 | A * | 3/1983 | Hudson, Jr. ............. | 361/45 |
| 4,796,144 | A * | 1/1989 | Swift ..................... | 361/42 |
| 4,800,509 | A | 1/1989 | Nimmersjo | |
| 4,947,469 | A | 8/1990 | Vokey et al. | |
| 5,341,265 | A | 8/1994 | Westrom et al. | |
| 5,369,366 | A | 11/1994 | Piesinger | |
| 5,512,832 | A | 4/1996 | Russell et al. | |
| 5,543,995 | A | 8/1996 | Kumagai et al. | |
| 5,592,093 | A | 1/1997 | Klingbiel | |
| 5,990,686 | A | 11/1999 | Vokey et al. | |
| 6,531,880 | B1 * | 3/2003 | Schneider et al. ....... | 324/539 |
| 6,707,652 | B2 | 3/2004 | Engel | |
| 6,747,459 | B2 | 6/2004 | Parker et al. | |
| 6,759,851 | B2 | 7/2004 | Hazelton | |
| 6,881,106 | B1 | 4/2005 | Gonring | |
| 6,888,708 | B2 | 5/2005 | Brungs et al. | |
| 6,948,846 | B2 | 9/2005 | Engel | |
| 6,972,936 | B2 * | 12/2005 | Morris .................... | 361/42 |
| 2006/0072270 | A1 * | 4/2006 | Mladenik et al. ....... | 361/93.1 |
| 2006/0209483 | A1 * | 9/2006 | Hurwicz ................. | 361/115 |
| 2008/0103609 | A1 * | 5/2008 | Smith ..................... | 700/22 |

FOREIGN PATENT DOCUMENTS

WO PCT/CA2007/002141   11/2007

* cited by examiner

*Primary Examiner*—Melissa J Koval
*Assistant Examiner*—Benjamin M Baldridge
(74) *Attorney, Agent, or Firm*—Matthew A. Pequignot; Pequignot + Myers LLC

(57) ABSTRACT

A resistive fault condition detector for conducting one or more tests of a circuit to detect a resistive fault condition. The detector includes means for determining changes in current through a load during the test, and means for measuring changes in first and second voltages respectively between the circuit's live and neutral conductors and between the circuit's neutral and ground conductors during the test, the changes in the first and second voltages corresponding to the changes in the current respectively. The detector also includes means for calculating apparent source impedances for the live and neutral conductors respectively, based on the changes in current and the measured changes in the first and second voltages respectively, and means for calculating an estimated source impedance for each of the live and neutral conductors for the test.

33 Claims, 19 Drawing Sheets

METHOD AND APPARATUS FOR DETECTION OF RESISTIVE FAULT CONDITIONS

This application claims the benefit of U.S. Provisional Application No. 60/867,674, filed on Nov. 29, 2006.

FIELD OF THE INVENTION

This invention is related to a detector for detecting a resistive fault condition in an electrical circuit.

BACKGROUND OF THE INVENTION

Electrical wiring systems employ a variety of connection means, for example, wire binding screw terminals, wire nuts, pressure-wire terminals, insulation displacement terminals, insulation piercing terminals, and push-in terminals. These types of connections are used in a variety of ways to permanently connect wires to electrical devices and terminal strips, as well as to make direct wire-to-wire connections.

However, for various reasons, some electrical connections are faulty or incomplete. For instance, electrical connections can loosen over time, and in some cases connections are loose due to improper installation or because they were otherwise improperly made. Also, connections that rely on screws (i.e., to fasten one conductor directly to another) can loosen due to vibration. As well, connections to ductile conductors like aluminium can loosen through deformation of the conductors. In addition, loose connections in series with medium to large loads sometimes result in small arcs that, over time, degrade already loose contact surfaces through pitting and burning.

Accordingly, loose connections can be poor electrical conductors, i.e., they can create high resistance junctions. These connections can heat excessively with high electrical current passing through the junction.

As is well known by fire investigators, high resistance connections cause fires. For example, with a 10 Amp load (not unusual in residential wiring systems), a 1 Ohm resistive connection must dissipate 100 Watts, and a 2 Ohm resistive connection must dissipate 200 Watts. It has been demonstrated that resistive connections can glow red-hot with normal household loads.

As is also known, the current that flows when a short circuit occurs is related to the impedance of the circuit. It is also known that circuit breakers of the type employed to protect branch circuits are designed to respond virtually instantaneously to short circuit conditions, and much more slowly to moderate overcurrent conditions. With unusually high circuit impedance from resistive connections, excessive wire length, and/or a large number of connections, the current that flows in a short circuit can be significantly reduced. This can have an adverse effect on the instantaneous tripping characteristics of circuit breakers, even to the point where the instantaneous tripping capability is ineffective in a short circuit condition.

Symptoms of Resistive Fault Conditions

The following are some typical symptoms of resistive fault conditions.

Reduced line voltage on circuits beyond the resistive connection. Voltage drop can be as little as a few volts when a fire hazard exists. This voltage drop is easily masked by variations in normal line voltage. Significant voltage drops can cause the line voltage to fall below normal limits.

Line voltage fluctuations with changing loads on circuit extremities beyond the resistive connection. The voltage drop (and heat) associated with a resistive connection is directly related to the current flow.

Increased heat at an electrical box containing a resistive connection. Electrical wiring and devices generate heat under normal conditions. Resistive connections are unique in that the heat is concentrated in a small area within the electrical box, but this can be masked by normal heating that occurs with large load currents.

Safety Hazards of Resistive Fault Conditions

The following are some safety hazards resulting from resistive fault conditions.

The primary hazard is fire caused directly by ignition of flammable materials close to the resistive connection.

Resistive connections can melt plastics and degrade insulation, creating a shock hazard.

Currently, the common way to detect loose connections resulting in resistive fault conditions is to disassemble and examine each permanent connection in an electrical system.

SUMMARY OF THE INVENTION

In its broad aspect, the invention provides a resistive fault condition detector for conducting one or more tests of a circuit to detect a resistive fault condition. The detector includes means for determining changes in current through a load during the test, and means for measuring changes in first and second voltages respectively between the circuit's live and neutral conductors and between the circuit's neutral and ground conductors during the test. The measured changes in the first and second voltages correspond to the changes in said current respectively. Also, the detector includes means for calculating apparent source impedances for the live and neutral conductors respectively based on the changes in the current and the measured changes in the first and second voltages respectively. In addition, the detector includes means for calculating an estimated source impedance for each of the live and neutral conductors respectively for the test.

In another aspect, the resistive fault condition detector additionally includes means for generating an alarm signal if any of the respective estimated source impedances for the live conductor and the neutral conductor exceeds a respective predetermined threshold value therefor.

In another of its aspects, the resistive fault condition detector additionally includes means for determining an imbalance between the respective estimated source impedances for the live and neutral conductors.

In yet another aspect, the resistive fault condition detector additionally includes means for generating an alarm signal if the imbalance exceeds a predetermined imbalance threshold value.

In another aspect, the changes in current are determined by measurement of said current.

In another aspect, the load is connected to the circuit during the test to produce the changes in current.

In yet another aspect, the load has known characteristics and the changes in current are determined by calculation thereof.

In another of its aspects, the invention provides a resistive fault condition detector which includes means for initiating a test and means for determining a change in current through a load during the test. Also, the detector includes means for measuring a change in each of first and second voltages respectively between the circuit's live and neutral conductors and between the circuit's neutral and ground conductors during the test, the measured changes in each of the first and second voltages corresponding to the change in said current. As well, the detector includes means for calculating at least one apparent source impedance for each of the live and neutral conductors respectively based on the change in current and the measured changes in said first and second voltages. The detector also includes means for calculating an estimated source impedance for each of the live and neutral conductors respectively for the test, and means for generating an alarm signal if any one of the respective estimated source impedances for the live conductor and the neutral conductor exceeds a respective predetermined threshold value therefor.

In yet another of its aspects, the invention provides a resistive fault condition detector which includes means for initiating a test, means for determining a change in current through a load during the test, and means for measuring a change in each of first and second voltages respectively between the circuit's live and neutral conductors and between the circuit's neutral and ground conductors during the test. The measured changes in each of said first and second voltages correspond to the change in current. Also, the detector includes means for calculating at least one apparent source impedance for each of the live and neutral conductors respectively based on the change in current and the measured changes in each of said first and second voltages. The detector additionally includes means for calculating an estimated source impedance for each of the live and neutral conductors respectively for the test, and means for determining an imbalance between the respective estimated source impedances for the live and neutral conductors.

In yet another of its aspects, the invention provides a resistive fault condition detector including means for determining changes in current through the load, and means for measuring changes in first and second voltages respectively between the circuit's live and neutral conductors and between the circuit's neutral and ground conductors. The measured changes in the first and second voltages correspond to the changes in current respectively. Also, the detector includes means for calculating apparent source impedances for the live and neutral conductors respectively based on the changes in current and the measured changes in the first and second voltages respectively, and means for calculating estimated source impedances for the live and neutral conductor respectively.

BRIEF DESCRIPTION OF THE DRAWINGS

The invention will be better understood with reference to the attached drawings, in which.

DETAILED DESCRIPTION

In this specification and the claims that follow, reference will be made to certain words and phrases that shall be defined to have the following meanings.

Resistive Fault Condition: A "resistive fault", a "resistive connection", or a "resistive fault condition" is intended to mean a connection between two conductors with abnormally high resistance.

Permanent Connection: A "permanent connection" is intended to mean a connection between two conductors which is meant to be substantially permanent.

Temporary Connection: A "temporary connection" is intended to mean a connection between two conductors which is meant to be temporary, e.g., when a plug is inserted into a receptacle.

Figure 1:
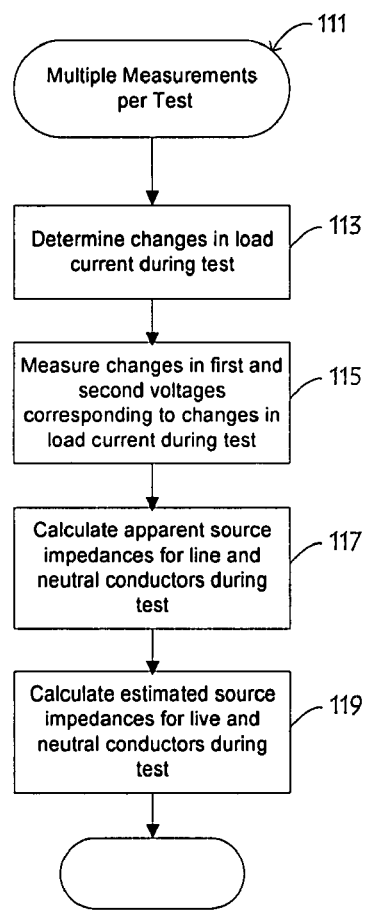
FIG. 1 is a flow chart schematically illustrating an embodiment of a method of the invention.
Figure 3:
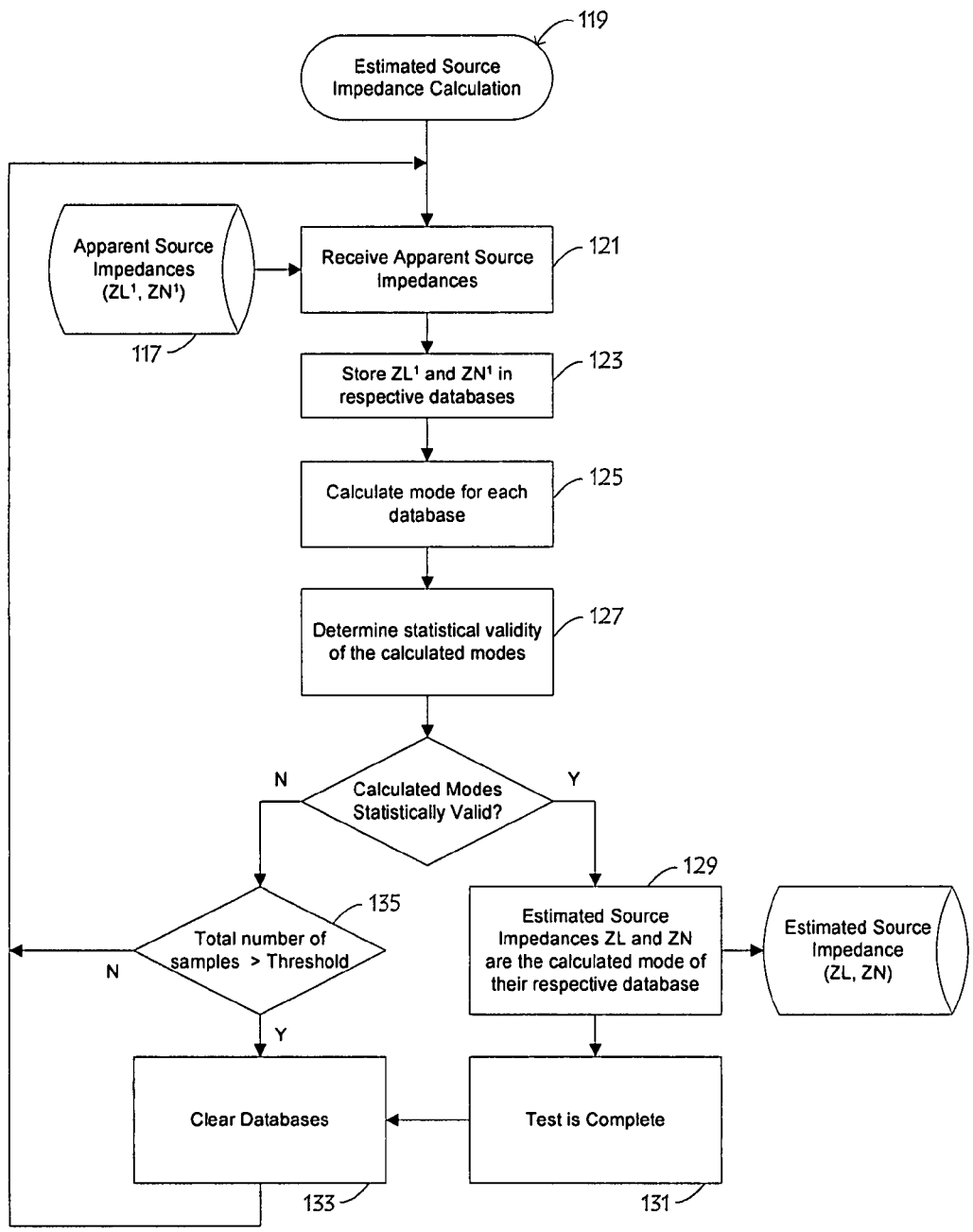
FIG. 3 is a flow chart schematically illustrating a portion of an embodiment of a method of the invention.
Figure 8:
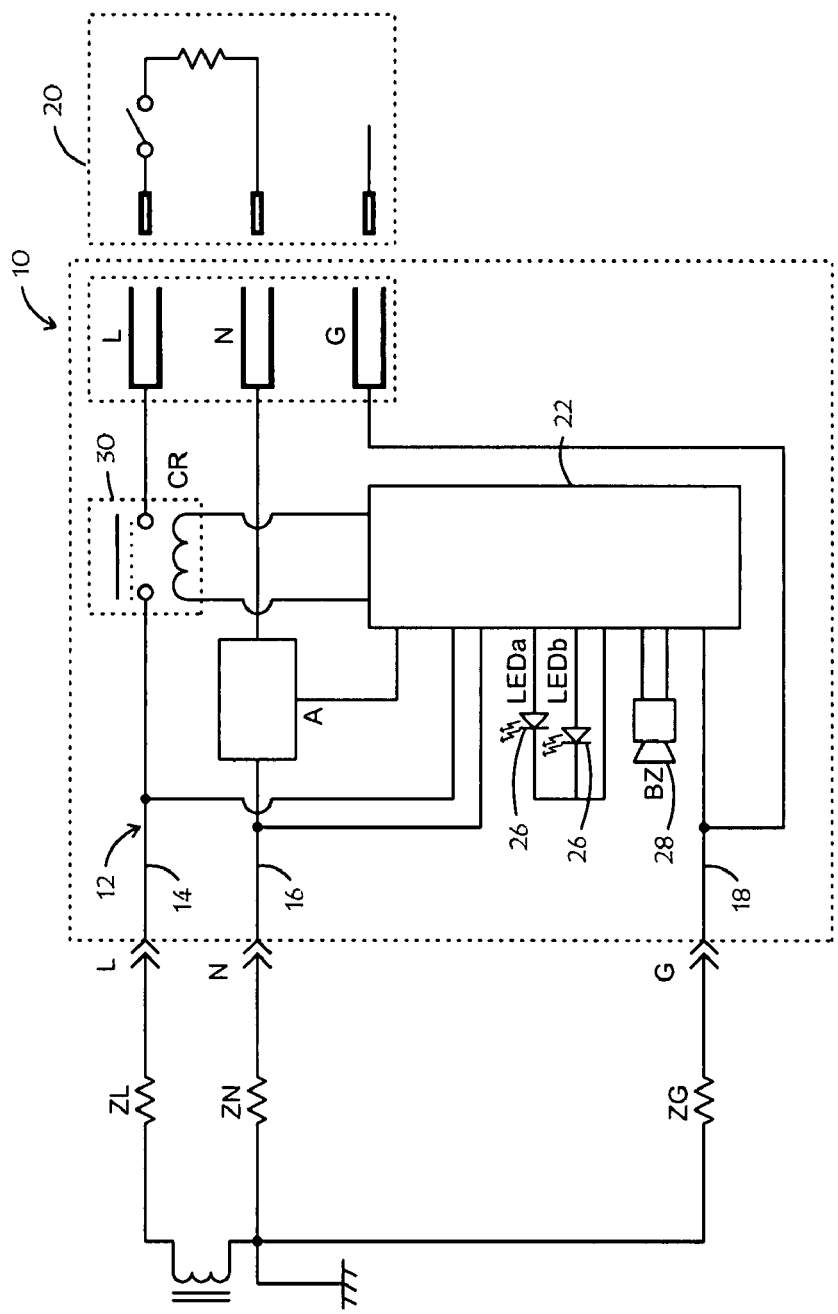
FIG. 8 is a block diagram representing an embodiment of a resistive fault condition detector of the invention.

Reference is first made to FIGS. 1, 3 and 8 to describe an embodiment of a method 111 of the invention for detecting a resistive fault condition (FIG. 1) and an embodiment of a resistive fault condition detector 10 of the invention (FIG. 8). FIG. 1 illustrates the method 111 of the operation of the resistive fault condition detector 10 through an operational flow chart. The resistive fault condition detector 10 is for conducting one or more tests of a circuit 12 which includes a live conductor 14, a neutral conductor 16, a ground conductor 18, and a load 20 (FIG. 8), as will be described. As shown in FIG. 1, the method 111 begins at step 113, where changes in current through the load 20 during the test are determined. Next, at step 115, changes in a first voltage and a second voltage respectively between the live and neutral conductors 14, 16 and between the neutral and ground conductors 16, 18 during the test, and corresponding to the changes in the current respectively, are measured. In the next step (step 117), apparent source impedances are calculated. The apparent source impedances are for the live and neutral conductors respectively based on the changes in the current during the test and the measured changes in the first and second voltages respectively. Finally, in step 119, an estimated source impedance is calculated for each of the live and neutral conductors respectively for that test, as will be described.

In one embodiment (hereinafter referred to as "passive" for convenience), the detector 10 preferably monitors and measures natural changes in load current and correlates the load current changes to simultaneous changes in line voltage (FIG. 8). Since line voltage changes are also caused by effects other than load current changes, the detector 10 monitors a number of changes in load current and related changes in line voltage calculating the apparent source circuit impedance for each, as will be described. The detector 10 preferably includes a control circuit 22 having means for determining changes in load current during a test, means for measuring changes in voltages between the live and neutral conductors and between the neutral and ground conductors respectively, and means for calculating apparent source impedances. The control circuit 22 preferably also includes means for calculating estimated source impedances, as will also be described.

After performing and recording a number of apparent source circuit impedance measurements in a test, the detector 10 calculates the arithmetic mode for the set, i.e., step 119 is performed by the detector 10. As is required for calculation of arithmetic mode for a continuous distribution of measurements, each measurement is quantized into equidistant intervals determined by the ultimate measurement resolution required. If the number of calculated impedances that match the mode is less than a predetermined proportion, then the mode calculation results are discarded. After successfully capturing a sequence of measurements where the number of calculated impedances that match the mode is greater than a predetermined proportion, the arithmetic mode calculation for the series of calculated impedances is considered to accurately represent the supply wire impedance, and such calculated impedance for a conductor is described herein as "estimated".

It can therefore be seen that step 119 represents several steps for a test, as schematically illustrated in FIG. 3. Once apparent source impedances have been calculated (step 117), the apparent source impedances are received (step 121) and stored in respective databases (step 123), i.e., preferably a database for each of ZL and ZN for the test. In the next step, the mode of the apparent source impedances for a particular conductor (live or neutral) for the test is calculated (step 125). Next, the statistical validity of the calculated modes is determined (step 127). If a calculated mode is found to be statistically valid, then the calculated mode for the conductor in question, and for the test, is considered to be the estimated source impedance for that conductor (step 129). The test is complete after the calculated mode for each database is deemed to be statistically valid (step 131).

As described above, in one embodiment, multiple measurements preferably are made in each test. After each apparent source impedance is calculated, it is processed as schematically illustrated in FIG. 3, i.e., beginning with step 121. Each new apparent source impedance is added to the database (step 123) for each apparent source impedance respectively (i.e., for the live and neutral conductors respectively), and the mode is calculated for the database after each new apparent source impedance is added to the database therefor (step 125). Preferably, the process set out in FIG. 3 preferably continues until the calculated modes are determined to be statistically valid. Those skilled in the art will appreciate that such process may, in any particular test, require a relatively large or a relatively small number of measurements (i.e., on which to base apparent source impedances), depending on the consistency or otherwise of the measurements.

As shown in FIG. 3, after the test has been successfully completed (step 131), then the databases are cleared (step 133), so that the process can be repeated for apparent source impedances calculated in the next test.

Preferably, the process illustrated in FIG. 3 additionally includes a self-recovery mechanism having a step of comparing the number of samples taken to a predetermined threshold number (step 135). If the number of samples exceeds the threshold number before the database modes are found to be statistically valid, then the databases are cleared (step 133), and the same test continues with a new set of samples.

Additional embodiments of the invention are disclosed in FIGS. 2A, 2B, 4-14, 15A, 15B, 16A, 16B, 17A, and 17B. In FIGS. 2A, 2B, 4-14, 15A, 15B, 16A, 16B, 17A, and 17B, elements are numbered so as to correspond to like elements shown in FIGS. 1-3 and 8.

Figure 9:
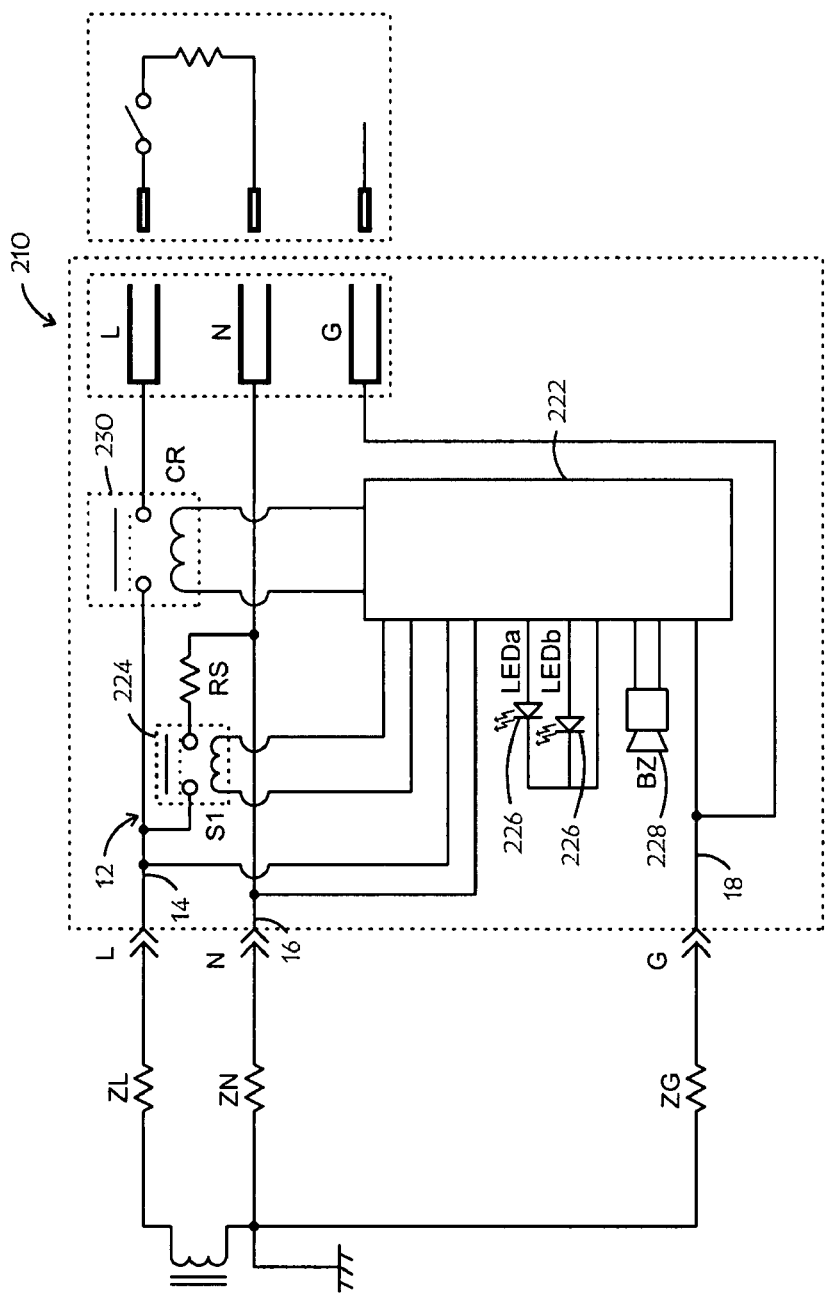
FIG. 9 is a block diagram representing another embodiment of a resistive fault condition detector of the invention.

In another embodiment (hereinafter referred to as "active" for convenience), a detector 210 measures changes in voltage which result from connecting a load having known characteristics to the circuit (FIG. 9). The detector 210 generally functions like the detector 10, except that instead of relying on natural changes in load current of a connected load, the detector 210 creates "artificial" changes in load current by temporarily switching a known load 224 into the circuit 12 (FIG. 9). The load 224 has known characteristics. Since the detector 210 controls the switching of the additional load 222, the detector 210 is better able to discriminate between changes in line voltage caused by the additional current and any such changes which are due to other causes, as will be described. The detector 210 preferably includes a control circuit 222 having means for determining changes in current during a test, means for measuring changes in voltages between the live and neutral conductors and between the neutral and ground conductors respectively, and means for calculating apparent source impedances. The control circuit 222 preferably also includes means for calculating estimated source impedances, as described in FIG. 3.

The means of connecting and disconnecting the load 224 to the supply circuit preferably is a relay, thyristor or similar switching device controlling connection of a resistor or other load of predetermined characteristics to the supply circuit. Alternatively, the means of connecting and disconnecting the load 224 to the supply circuit includes a plurality of relays, thyristors or similar switching devices each controlling connection of a different resistor or other load of predetermined characteristics to the supply circuit. Alternatively, the means of connecting and disconnecting the load 224 to the supply includes a relay, thyristor or similar switching device controlling connection of a socket, and an attached load of predetermined characteristics to the supply circuit.

Figure 2A:
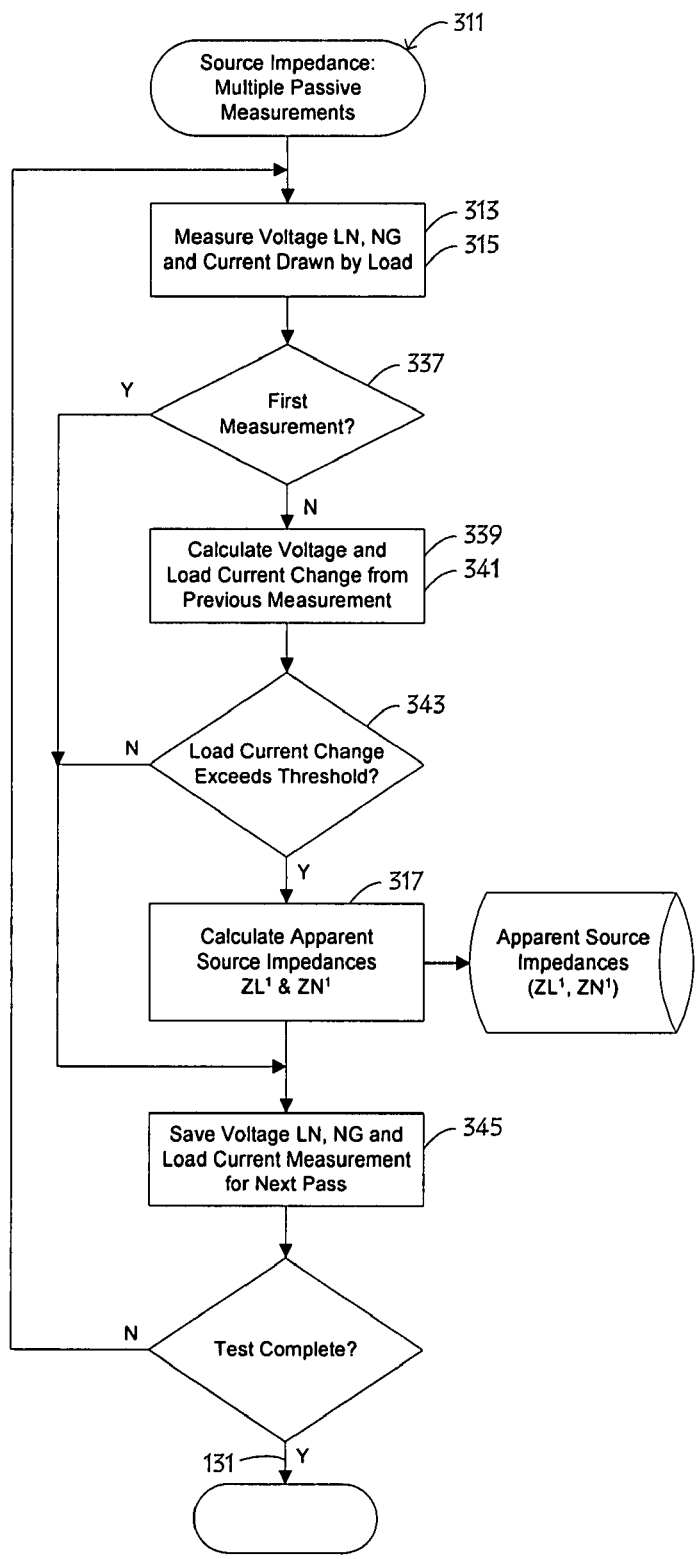
FIG. 2A is a flow chart schematically illustrating another embodiment of a method of the invention.

FIGS. 2A and 3 schematically illustrate another embodiment of a method 311 of the invention. The method 311 involves making multiple passive measurements during a test. As will be described, the estimated source impedances resulting from the method 311 may be compared to threshold values, to determine whether estimated impedances are within acceptable limits.

The method 311 begins with the step 313 of measuring current drawn by the load 20, and the step 315 of measuring voltages between the live and the neutral conductors and between the neutral and the ground conductors. As indicated in FIG. 2A, if the current and the voltages are the first measurements in a test, then additional measurements are taken (step 337), so that changes in voltage and current during the test can be determined.

If the measured current and voltage are not the first measurements (step 337), then the method proceeds to steps 339 and 341. In steps 339 and 341 respectively, the load current change and the voltage changes relative to previous respective measurements thereof during the test are calculated.

The method 311 preferably also includes step 343. In step 343, the change in load current is compared to a threshold current value. The purpose of this comparison is to ensure that only relatively larger changes in current that will yield usable changes in voltage sufficient to make the apparent source impedance calculations are selected. In effect, changes in current are selected which are sufficiently large that the relative effects of changes in voltage which result from effects other than the observed changes in current are reduced. Although it is preferred that the method 311 include the step 343, those skilled in the art will appreciate that the method 311 would be workable in the absence of this step.

If the changes in load current are sufficient, then apparent source impedances are calculated (step 317).

In the next step, the apparent source impedances for the live and neutral conductors respectively are used to calculate respective estimated source impedances (step 119), as schematically illustrated in FIG. 3. As described above, once the calculated mode for each database is deemed to be statistically valid (step 129), then the test is complete (step 131).

Preferably, the method 311 also includes the step 345 of saving the measured voltage and the load current measurement for the next measurements, in the event that the test is not completed at that point.

Figure 5:
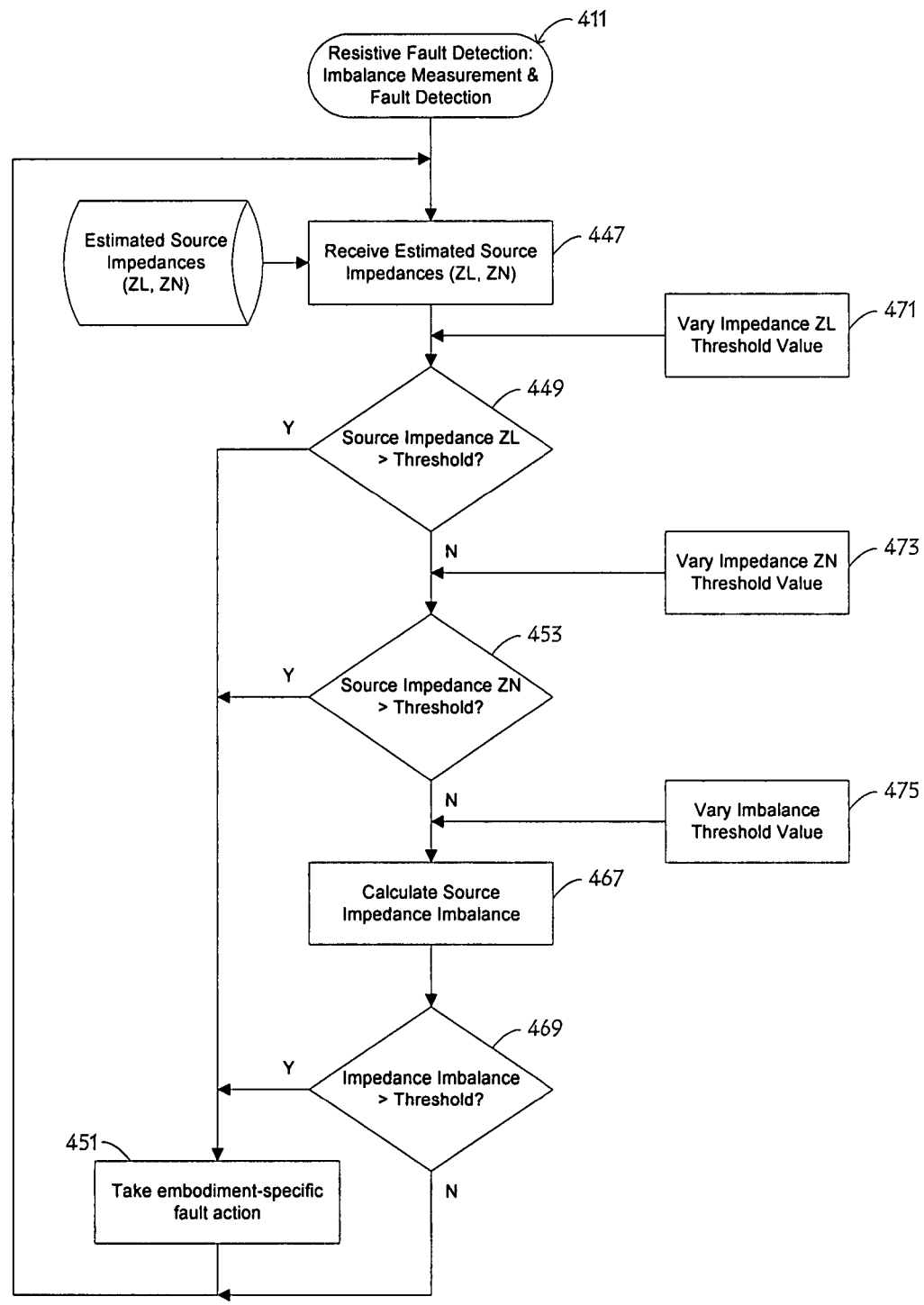
FIG. 5 is a flow chart schematically illustrating a portion of an embodiment of a method of the invention.

As noted above, the estimated source impedances resulting from the method 311 may be compared to threshold values, to determine whether the estimated source impedances are within acceptable limits. As can be seen in FIG. 5, a method 411 of detecting resistive fault conditions based on estimated source impedances is schematically illustrated. In step 447, estimated source impedances for the live and neutral conductors (e.g., as determined in a test conducted in accordance with the method 311) are received. The estimated source impedance for the live conductor (ZL) is compared to a predetermined threshold value therefor (step 449). If the estimated source impedance (ZL) exceeds the predetermined threshold value therefor, then an alarm signal is generated (step 451). However, if ZL does not exceed the predetermined threshold value therefor, then the estimated source impedance for the neutral conductor (ZN) is compared to a predetermined threshold value therefor (step 453). If ZN exceeds the predetermined threshold value therefor, then the alarm signal is generated (step 451).

It will be appreciated by those skilled in the art that, although step 449 is shown as preceding step 453 in FIG. 5, the sequence of these two steps is not functionally significant, i.e., step 453 could precede step 449. Those skilled in the art will also appreciate that a device may be adapted to perform only one of steps 449 and 453, if desired, because such steps are functionally independent of each other.

In summary, after estimated source impedances have been determined in a test via the method 311, the method 411 is used to determine whether the estimated source impedances exceed predetermined threshold values therefor. In addition, according to the method 411, in the event that either of the estimated source impedances for the live conductor and the neutral conductor exceeds the predetermined threshold values therefor respectively, the alarm signal is generated, resulting in an embodiment-specific fault action, as will be described.

As indicated in FIG. 8, the resistive fault condition detector 10 preferably includes means 26 for providing a predetermined visual signal, the means being activated upon receipt thereof of the alarm signal. For exemplary purposes only, the means 26 is shown as including two LEDs with appropriate circuitry, but any suitable light-providing or other visual effect provider could be used.

The resistive fault condition detector 10 preferably also includes, for exemplary purposes, means 28 for providing a predetermined audible signal upon receipt thereof of the alarm signal. For example, the means 28 can be a buzzer, or other suitable device. It will be understood that the detector 10 may include means 26 or means 28 or, if preferred, both.

As can be seen in FIG. 8 the detector 10 preferably also includes, for exemplary purposes, means 30 for disconnecting the live conductor upon receipt thereof of the alarm signal. For example, the resistive fault condition detector 10 illustrated in FIG. 8 preferably is included in a receptacle to which the load 20 may be temporarily connected.

It will be understood that the resistive fault condition detector 10 may include, for example, only one of the means 26, means 28, and the means 30, or any combination thereof.

Figure 2B:
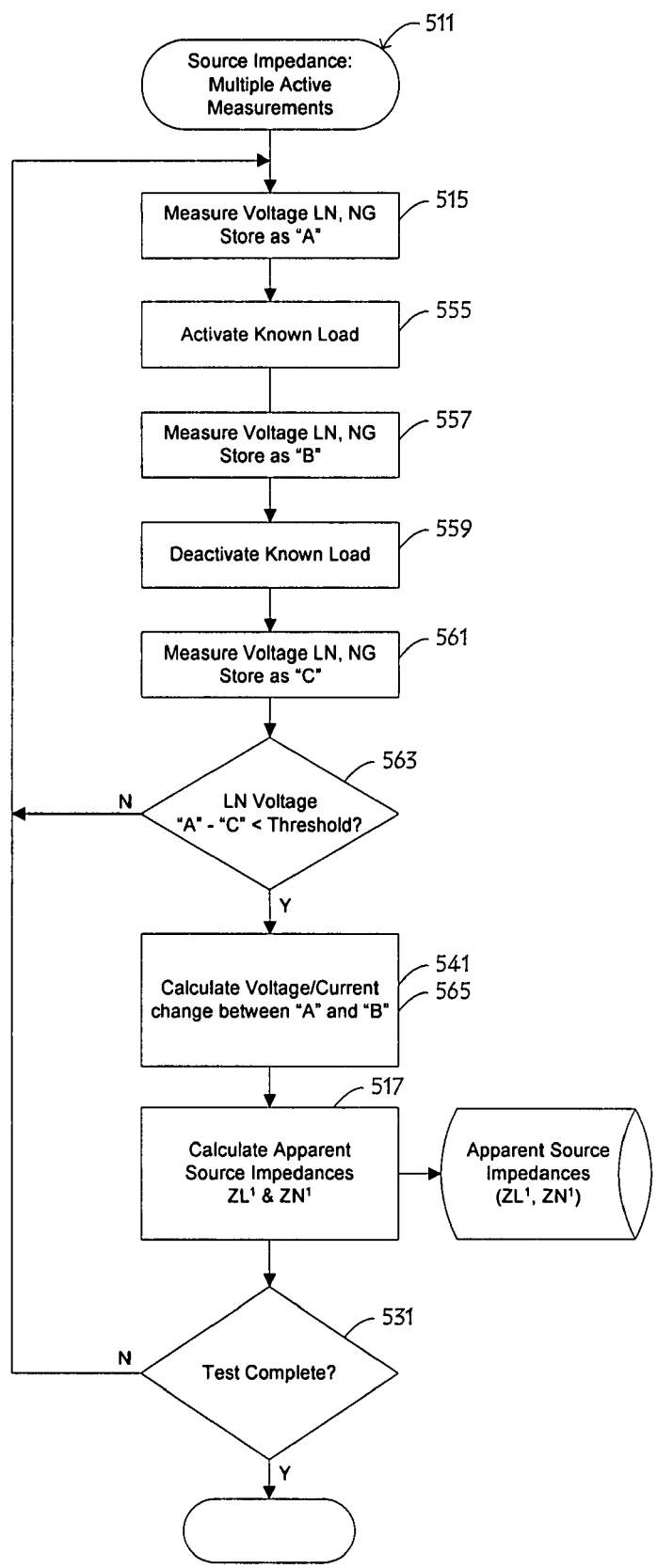
FIG. 2B is a flow chart schematically illustrating another embodiment of a method of the invention.

FIGS. 2B and 3 schematically illustrate another embodiment of a method 511 of the invention. The method 511 involves multiple active measurements during a test, to result in estimated source impedances for the live and neutral conductors. As will be described, the estimated source impedances resulting from the method 511 may be used to determine whether the estimated impedances are within acceptable limits. The method 511 begins with the a step 515 of measuring voltages between the live and the neutral conductors (LN) and between the neutral and the ground conductors (NG), which data is stored and referred to for convenience as "A". Next, in step 555, the known load 224 is activated. In the next step, voltages between the live and the neutral conductors and between the neutral and the ground conductors are measured again, and such measured voltages are stored and referred to for convenience as "B" (step 557). The known load 224 is then deactivated (step 559).

Next, it is preferred that voltages between the live and the neutral conductors and between the neutral and the ground conductors are measured again, and such voltages are stored and referred to for convenience as "C" (step 561).

Preferably, the next step 563 is to compare LN voltage "A" to LN voltage "C". If the difference between such voltages is less than a predetermined threshold voltage difference, then the method continues, as described below. If the difference between such voltages is greater than the threshold voltage difference, however, then the process (i.e., beginning with step 515) is recommenced.

The steps 561 and 563 are preferred because they result in discarding measurements where line voltage changed due to effects other than the switched load. Those skilled in the art will appreciate that the method 511 is workable without steps 561 and 563. However, in the absence of steps 561 and 563, the method 511 would be more sensitive to interference. Accordingly, steps 561 and 563 are intended to ensure that the measured changes in voltage correspond largely to the changes in current in this method.

In step 541, voltage changes apparently resulting from activation of the known load are determined. In step 565, changes in current are calculated, based on the measured change in voltage and the known characteristics of the load 224. Next, apparent source impedances are calculated (step 517).

In the next step, the apparent source impedances for the live and neutral conductors respectively are used to calculate respective estimated source impedances (step 119), as schematically illustrated in FIG. 3. As described above, once the calculated mode for each database is deemed to be statistically valid (step 129), then the test is complete (step 531), i.e., the estimated source impedances have been determined for the test.

Preferably, in the next step, the estimated source impedances resulting from the method 511 may be compared to impedance threshold values, to determine whether the estimated source impedances exceed the impedance threshold values, as schematically illustrated in FIG. 5. As described above, the method 411 includes steps 447 and 449, in which estimated source impedances are compared to predetermined threshold values therefor for each of the live conductor and the neutral conductor. If the estimated source impedances for either of the live or the neutral conductors exceeds the predetermined threshold value therefor respectively, then the alarm signal is generated (step 451).

As described above, it is preferred that, in active testing, the load which is connected during the test has known characteristics. Accordingly, in the embodiment described above, it is not necessary to measure current, because current can be calculated from the known load characteristics and the measured voltage. In another embodiment of the invention, however, active testing is implemented using a load of unknown or imprecise characteristics. In this alternative embodiment, it is necessary to measure the current changes as well as the voltage changes.

Figure 2C:
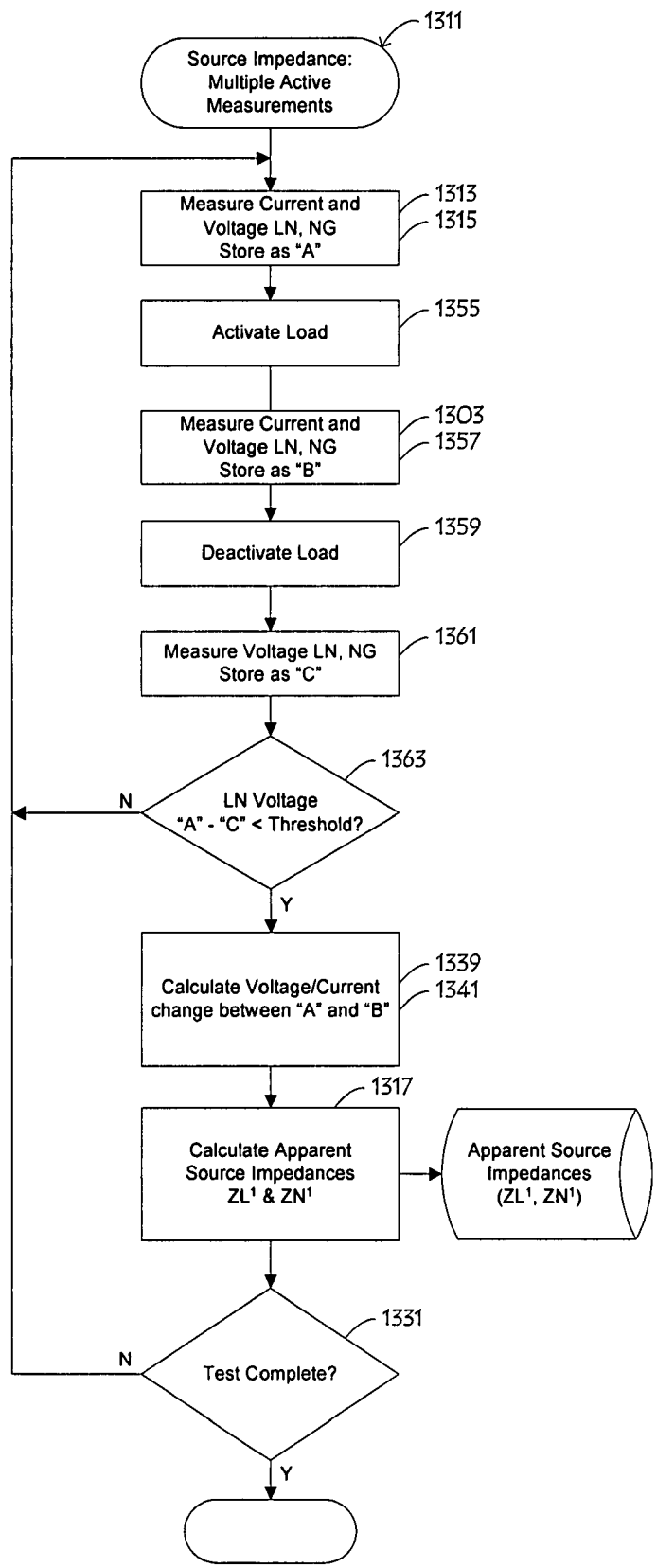
FIG. 2C is a flow chart schematically illustrating another embodiment of a method of the invention.

FIGS. 2C and 3 schematically illustrate another embodiment of a method 1311 of the invention, in which active testing is performed using a load having unknown or imprecise characteristics. The method 1311 involves multiple active measurements during a test, to result in estimated source impedances for the live and neutral conductors. As will be described, the estimated source impedances resulting from the method 1311 may be used to determine whether the estimated impedances exceed impedance threshold values. The method 1311 begins with the steps 1313 and 1315 of measuring current, voltage between the live and the neutral conductors (LN), and voltage between the neutral and the ground conductors (NG). The measured voltages are stored and referred to for convenience as "A". Next, in step 1355, the load, which has unknown or imprecise characteristics, is activated. In the next step, load current and voltages between the live and the neutral conductors and between the neutral and the ground conductors are measured again (steps 1303, 1357). The measured voltages are stored and referred to for convenience as "B". The load is then deactivated (step 1359).

Next, it is preferred that voltages between the live and the neutral conductors and between the neutral and the ground conductors are measured again, and such voltages are stored and referred to for convenience as "C" (step 1361).

Preferably, the next step 1363 is to compare LN voltage "A" to LN voltage "C". If the difference between such voltages is less than a predetermined threshold voltage difference, then the method continues, as described below. If the difference between such voltages is greater than the threshold voltage difference, however, then the process (i.e., beginning with steps 1313, 1315) is recommenced.

As noted above, the steps 1361 and 1363 are preferred because they result in discarding measurements where line voltage changed due to effects other than the switched load.

Those skilled in the art will appreciate that the method 1311 is workable without steps 1361 and 1363. However, in the absence of steps 1361 and 1363, the method 1311 would be more sensitive to interference. Accordingly, steps 1361 and 1363 are intended to ensure that the measured changes in voltage correspond largely to the changes in current in this method.

In steps 1339 and 1341, changes in current and voltage changes apparently resulting from activation of the known load are determined respectively. Next, apparent source impedances are calculated (step 1317).

In the next step, the apparent source impedances for the live and neutral conductors respectively are used to calculate respective estimated source impedances (step 119), as schematically illustrated in FIG. 3. As described above, once the calculated mode for each database is deemed to be statistically valid (step 129), then the test is complete (step 1331), i.e., the estimated source impedances have been determined for the test.

Preferably, in the next step, the estimated source impedances resulting from the method 1311 may be compared to impedance threshold values, to determine whether the estimated source impedances exceed the impedance threshold values, as schematically illustrated in FIG. 5. As described above, the method 411 includes steps 447 and 449, in which estimated source impedances are compared to predetermined threshold values therefor for each of the live conductor and the neutral conductor. If the estimated source impedances for either of the live or the neutral conductors exceeds the predetermined threshold value therefor respectively, then the alarm signal is generated (step 451).

As indicated in FIG. 9, the resistive fault condition detector 210 preferably includes means 226 for providing a predetermined visual signal, the means being activated upon receipt thereof of the alarm signal. For exemplary purposes only, the means 226 is shown as including two LEDs with appropriate circuitry, but any suitable light-providing or other visual effect provider could be used.

The resistive fault condition detector 210 preferably also includes, for exemplary purposes, means 228 for providing a predetermined audible signal upon receipt thereof of the alarm signal. For example, the means 228 can be a buzzer, or other suitable device. It will be understood that the detector 210 may include means 226 or the means 228 or, if preferred, both.

As can be seen in FIG. 9, the detector 210 preferably also includes, for exemplary purposes, means 230 for disconnecting the live conductor upon receipt thereof of the alarm signal. For example, the resistive fault condition detector 210 illustrated in FIG. 9 preferably is included in a receptacle.

It will be understood that the resistive fault condition detector 210 may include, for example, any one of the means 226, means 228, and the means 230, or any combination thereof.

As schematically illustrated in FIG. 5, an embodiment of the method 411 preferably includes a step 467 of determining an imbalance between the respective source impedances for the live and neutral conductors. Preferably, the imbalance is determined by comparing the estimated source impedances for each of the live and neutral conductors. When the conductors are wires which are in accordance with the applicable electrical code, there should be very close to the same length of wire and almost the same number of connections in each of the live and neutral circuits. Consequently, there should be little difference between the impedances of each circuit respectively. It will be understood that, for the purposes hereof, an imbalance can be zero. Preferably, the impedance imbalance is compared to a predetermined imbalance threshold value (step 469). If the impedance imbalance exceeds the predetermined imbalance threshold value, then the alarm signal is generated (step 451).

It will be appreciated by those skilled in the art that, although steps 449, 453, and 469 are shown in a particular sequence in FIG. 5, the sequence of these steps is not functionally significant, i.e., steps 467 and 469 could precede steps 449 and 453. In addition, those skilled in the art would appreciate that a device may include functionality to enable it to conduct only one of the comparisons shown in steps 449, 453, and 469, or any combination thereof.

In one embodiment, the method 411 preferably includes steps 471, 473 of varying the threshold impedance values. Although the impedance threshold values may be set when the detector 10, 210 is manufactured, it may be desirable to include a means for varying the impedance threshold value (s), depending on the application. For example, certain electrical installations may have unusual impedances or impedance imbalances due to length of wire and circuit configuration, which would otherwise cause a factory-configured resistance fault condition detector to trip. In these cases, a detector with adjustable impedance trip values can be adjusted not to trip on the unusual, but proper and intended, circuit impedance; but also, the detector will trip in any event if the impedance increases further, i.e., due to deterioration or damage. In one embodiment, the adjustment of impedance trip values is by manual setting of new trip values. In another embodiment, the adjustable impedance trip values can be automatically configured by applying predetermined margins to the current measured circuit impedances. In such embodiment, the impedance threshold value is "learned". Preferably, where the impedance threshold value is learned, the "learning" process is manually triggered by the installer.

Similarly, in another embodiment, the method 411 preferably includes a step 475 of varying the imbalance threshold. In another embodiment, the imbalance threshold is learned.

Figure 12:
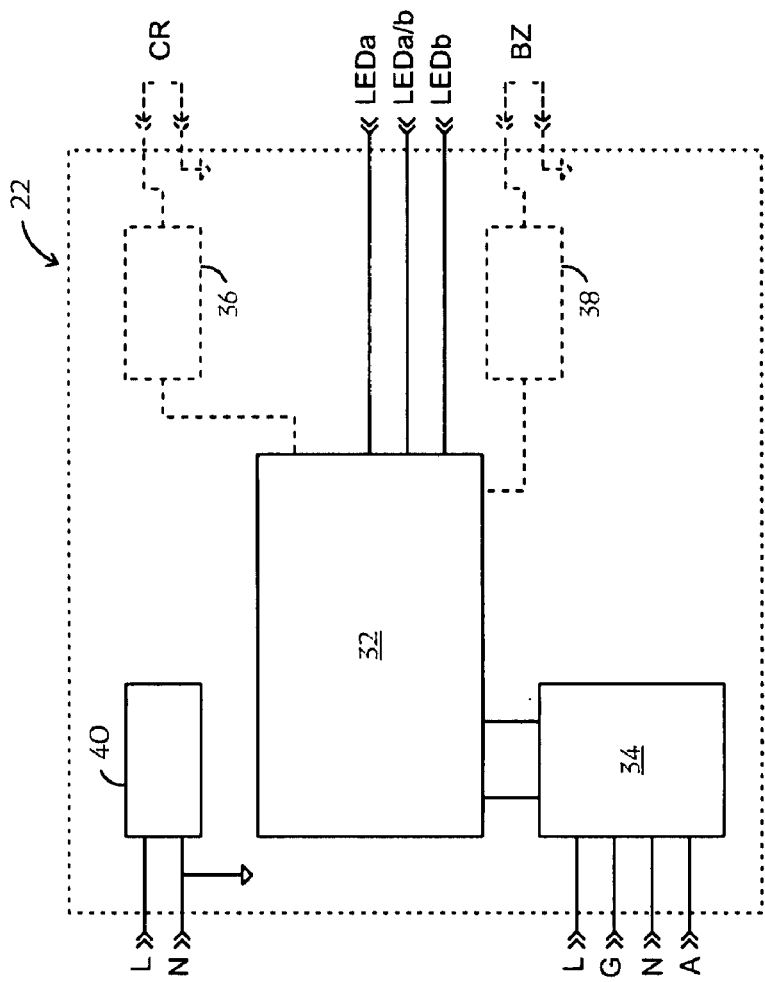
FIG. 12 is a block diagram representing another embodiment of a control circuit of the invention.

The control circuit 22 of the detector 10 is disclosed in FIG. 12. It will be understood that the control circuit 22 may be implemented in various ways, as is known by those skilled in the art. For example, the signal measurement, computation, comparison, alarm signal generation and time delay functions may be implemented using entirely analog circuits, a combination of analog and discrete digital circuits, or with analog circuits and a general purpose microprocessor with suitable software. Preferably, and as illustrated in FIG. 12, the control circuit 22 includes a microprocessor 32 containing suitable software, analog signal conditioning circuits 34 presenting prepared signals to analog inputs of the microprocessor 32, a relay driver circuit 36 controlled by the microprocessor 32, an annunciator driver circuit 38 controlled by the microprocessor 32, and indicator driver circuits incorporated into the microprocessor 32 and a power supply circuit 40.

It will be understood by those skilled in the art that the relay driver circuit 36 is only required for those embodiments of the detector 10 which include the disconnect means 30. Similarly, the annunciator driver circuit 38 is only required for an embodiment of the invention which includes the audible alarm 28.

Figure 11:
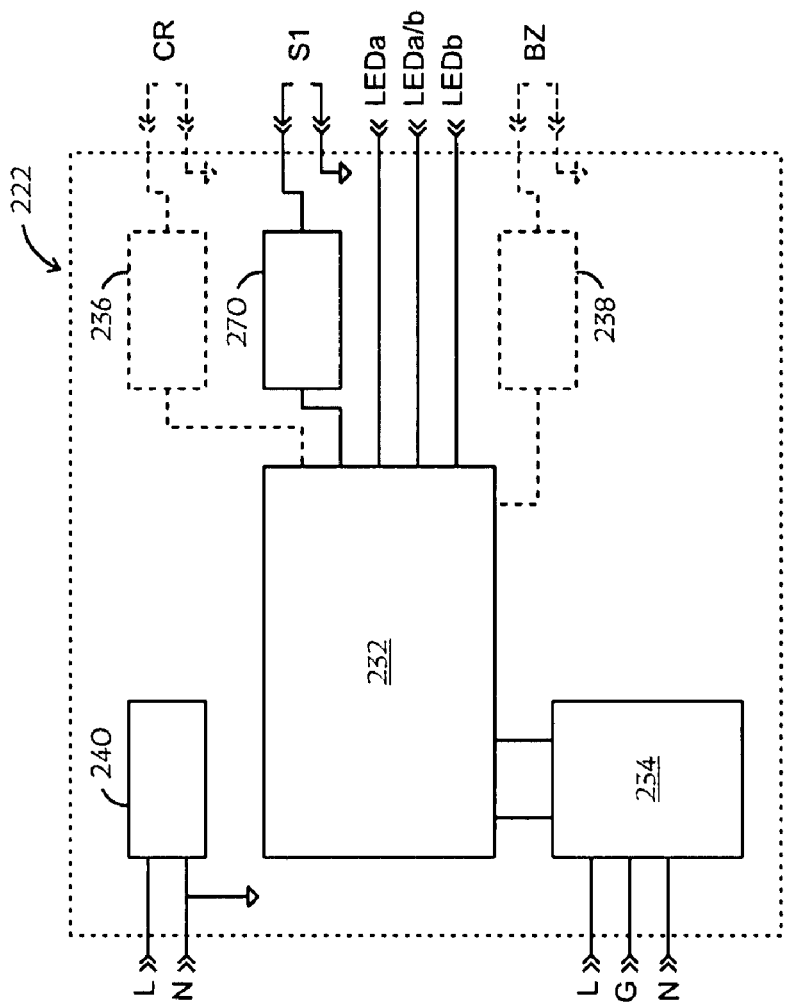
FIG. 11 is a block diagram representing an embodiment of a control circuit of the invention.

The control circuit 222 of the detector 210 is disclosed in FIG. 11. It will be understood that the control circuit 222 may be implemented in various ways, as is known by those skilled in the art. For example, the signal measurement, computation, comparison, alarm signal generation and time delay functions may be implemented using entirely analog circuits, a combination of analog and discrete digital circuits, or with analog circuits and a general purpose microprocessor with suitable software. Preferably, and as illustrated in FIG. 12, the control circuit 222 includes a microprocessor 232 containing suitable software, analog signal conditioning circuits 234 presenting prepared signals to analog inputs of the microprocessor 232, a first relay driver circuit 236 controlled by the microprocessor 232, an annunciator driver circuit 238 controlled by the microprocessor 232, and indicator driver circuits incorporated into the microprocessor 232 and a power supply circuit 240. The first relay driver circuit 236 is for controlling the disconnect means 230. The control circuit 222 preferably also includes a second relay driver circuit 270 for controlling the connection and disconnection of the load 224 to the circuit. Preferably, the second relay driver circuit 270 is also controlled by the microprocessor 232.

It will be understood by those skilled in the art that the first relay driver circuit 236 is only required for those embodiments of the detector 210 which include the disconnect means 230. Similarly, the annunciator driver circuit 238 is only required for an embodiment of the invention which includes the audible alarm 228.

As will be appreciated by those skilled in the art, the resistive fault condition detector functionality can be incorporated into devices (e.g. receptacles) having other functionality such as overload fault interrupter, shock fault interrupter, power fault interrupter, ground fault interrupter, arc fault interrupter, and various non-protective functions such as home automation control and communication functions.

In addition, the resistive fault condition detector functionality can be incorporated into devices which are permanently connected or temporarily connected. The resistive fault condition detector may be included in an outlet, or the detector may be connected in-line, i.e., as an in-line protector device. The detector also may be included as a wiring device positioned in a box, to monitor a circuit. The resistive fault condition detector may alternatively be included in a cover plate subassembly, as will be described.

The resistive fault condition detector may also be temporarily connected, i.e., the detector may be included in a portable tester device. It will be appreciated by those skilled in the art that the resistive fault condition detector may be included in various devices for use in various applications.

Figure 14:
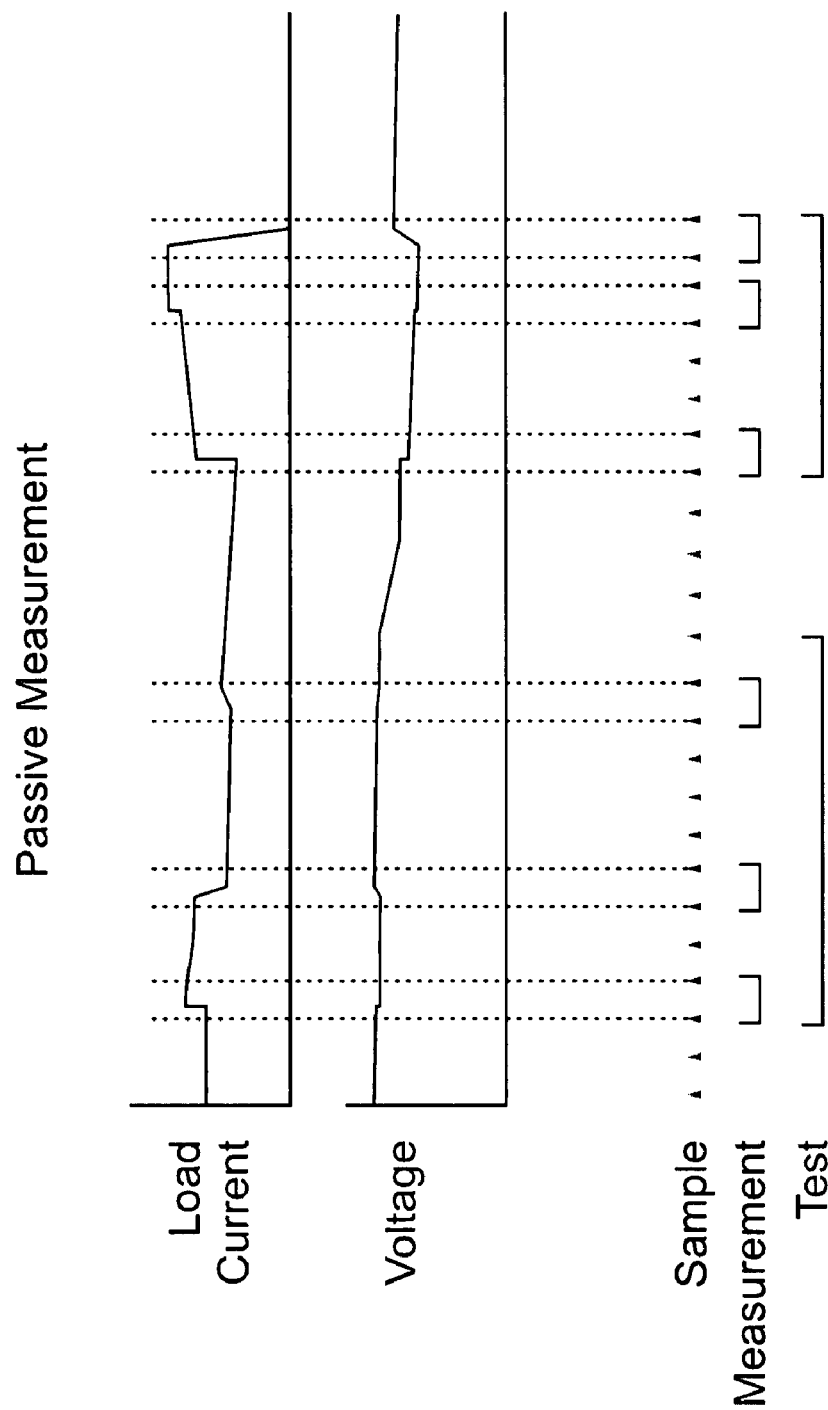
FIG. 14 is a series of graphs schematically illustrating load current and voltage variations over time in connection with another embodiment of a method of the invention.

In use, the resistive fault condition detector 10 is connected to the live conductor, the neutral conductor, and the ground conductor. As described above, the connection may be temporary or permanent. FIG. 14 provides an illustration showing exemplary passive testing. As indicated above, passive testing relies on independent changes in load current. In FIG. 14, three independent measurements of changes in current and voltage are made in each of the two tests illustrated. Each measurement consists of sampling the voltage and current until a suitable change in current is detected. As described above, each measurement results in the calculation of apparent source impedances (i.e., using before and after current and voltage samples). Since the changes in load current are asynchronous, the time required to perform a measurement is variable. As also described above, after a number of measurements (in the illustration, three in each test), the test is completed, because the estimated source impedance is calculated. FIG. 14 also shows that the test may be repeated, by repeating the entire sequence of measurements (i.e., starting by waiting for changes in load current again).

Preferably, the predetermined threshold impedance value for each of the live and neutral conductors is set before the resistive fault condition detector 10 is installed, but the impedance threshold values may be variable, and they may be "learned", as described above. In one embodiment, upon the estimated source impedances for either of the live and neutral conductors exceeding the respective predetermined threshold values therefor, the detector 10 generates the alarm signal, which may be transmitted to another device. As described above, however, it is also preferred that the resistive fault condition detector 10 additionally includes a means for taking an appropriate action to address the resistive fault condition, upon receipt thereof of the alarm signal.

As noted above, the detector 10 may provide for the step 467 of determining an imbalance between the respective source impedances for the live and neutral conductors. The imbalance is compared to the predetermined imbalance threshold value (step 469). If the impedance imbalance exceeds the predetermined imbalance threshold value, then the alarm signal is generated (step 451). As noted above, the imbalance threshold value may be set prior to installation. Alternatively, the imbalance threshold value may be variable, and it also may be "learned".

Alternatively, if it is desired to detect the resistive fault condition using the "active" approach, the resistive fault condition detector 210 is connected to the live conductor, the neutral conductor, and the ground conductor. As described above, the connection may be temporary or permanent.

Figure 13:
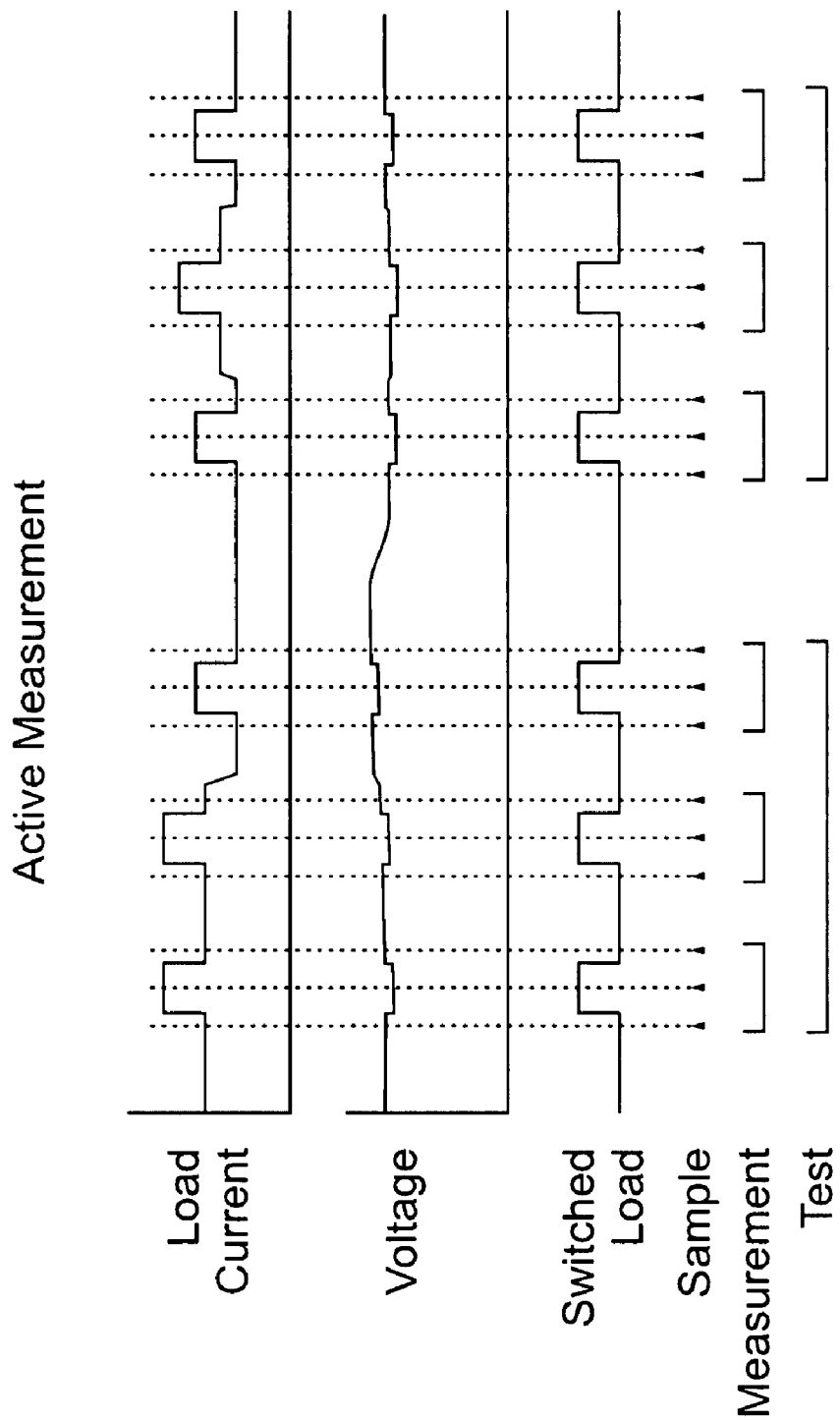
FIG. 13 is a series of graphs schematically illustrating load current and voltage variations over time in connection with an embodiment of a method of the invention involving a switched load.

FIG. 13 shows that active testing involves causing known changes in load current by turning on or off a known load. As can be seen in FIG. 13, a series of measurements of changes in current and voltage (three in the drawing for each test) is made. Each measurement consists of sampling the voltage before and after the known load is switched on and, as shown in FIG. 13, may include a third sample of the voltage after the load is turned off again. Each measurement results in the calculation of apparent source impedance. After a number of measurements (in the illustration in FIG. 13, three), the test is completed because the estimated source impedance has been calculated. The test may be repeated (as shown, i.e., the second test), by repeating the entire sequence of measurements.

Preferably, the predetermined threshold impedance value for each of the live and neutral conductors is set before the resistive fault condition detector 210 is installed, but the impedance threshold values may be variable, and they may be "learned", as described above. In one embodiment, upon the estimated source impedances for either of the live and neutral conductors exceeding the respective predetermined threshold values therefor, the detector 210 generates the alarm signal, which may be transmitted to another device. As described above, however, it is also preferred that the resistive fault condition detector 210 additionally includes a means for taking an appropriate action to address the resistive fault condition, upon receipt thereof of the alarm signal.

Figure 10:
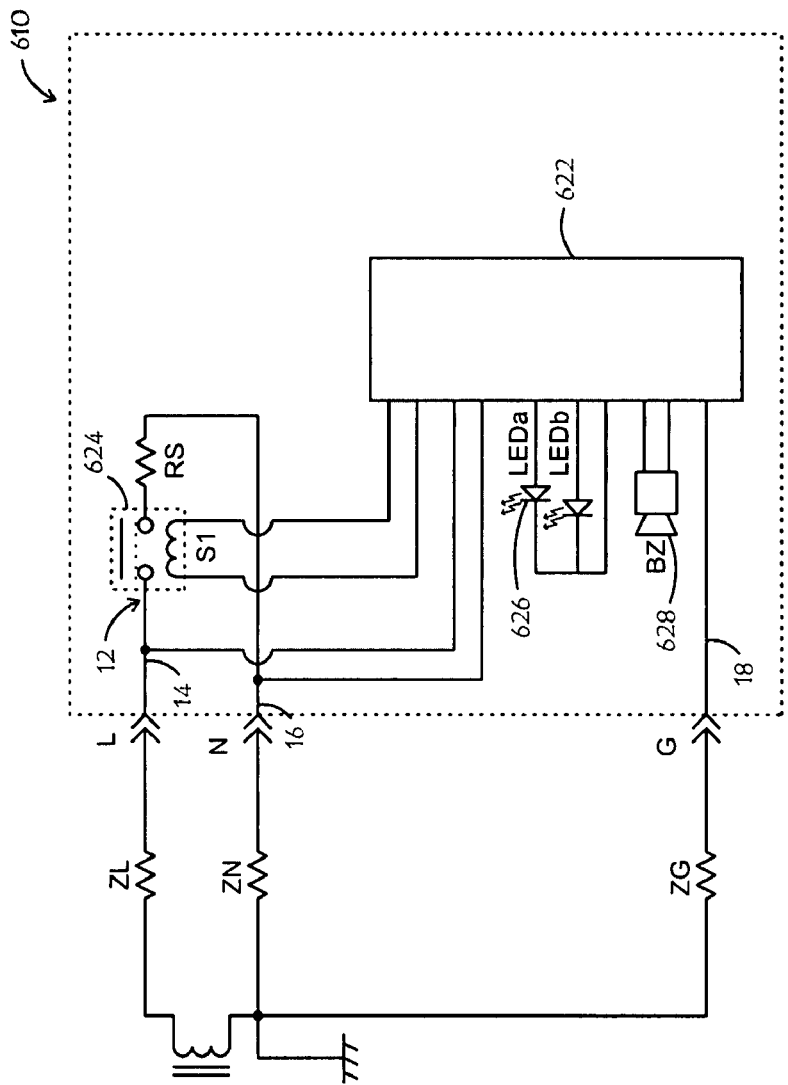
FIG. 10 is a block diagram representing another embodiment of a resistive fault condition detector of the invention.

FIG. 10 discloses an embodiment of a resistive fault condition detector 610 of the invention adapted for operation as an "active" detector (i.e., similar to the detector 210), but which does not include disconnect means. The detector 610 preferably includes a known load 624 which is connectable to, and disconnectable from, the circuit 12 as required. As shown, the detector 610 includes means for providing a visual signal 626 and a means for providing an audible signal 628. However, as described above, the detector 610 may include one or both or neither of means 626, 628.

As noted above, the detectors 10, 210, 610 may be provided in various devices. For exemplary purposes only, devices including the detectors of the invention are shown in FIGS. 15A, 15B, 16A, 16B, 17A, and 17B.

Figure 15B:
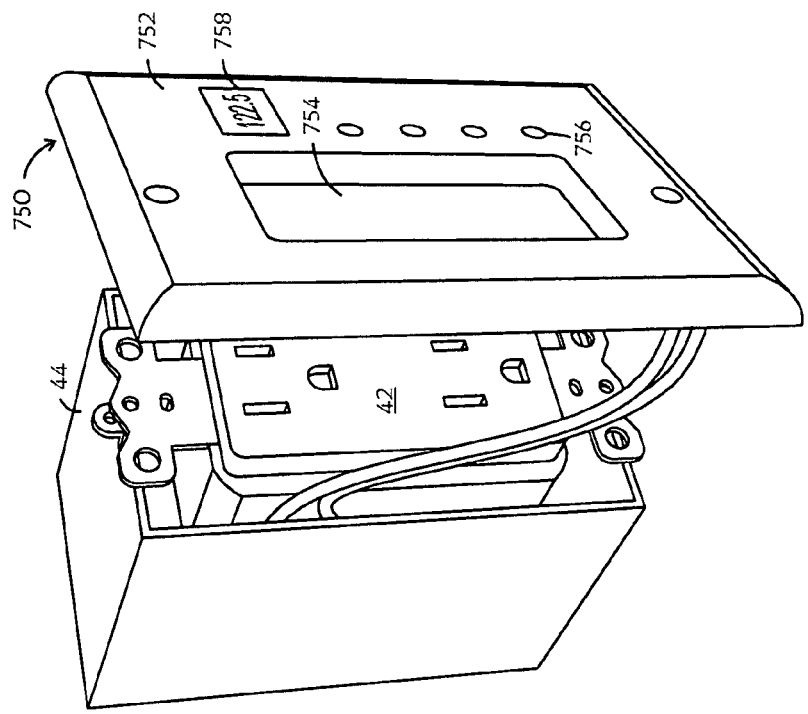
FIG. 15B is an isometric view of the cover plate subassembly of FIG. 15A positioned for installation over a receptacle of the prior art.
Figure 15A:
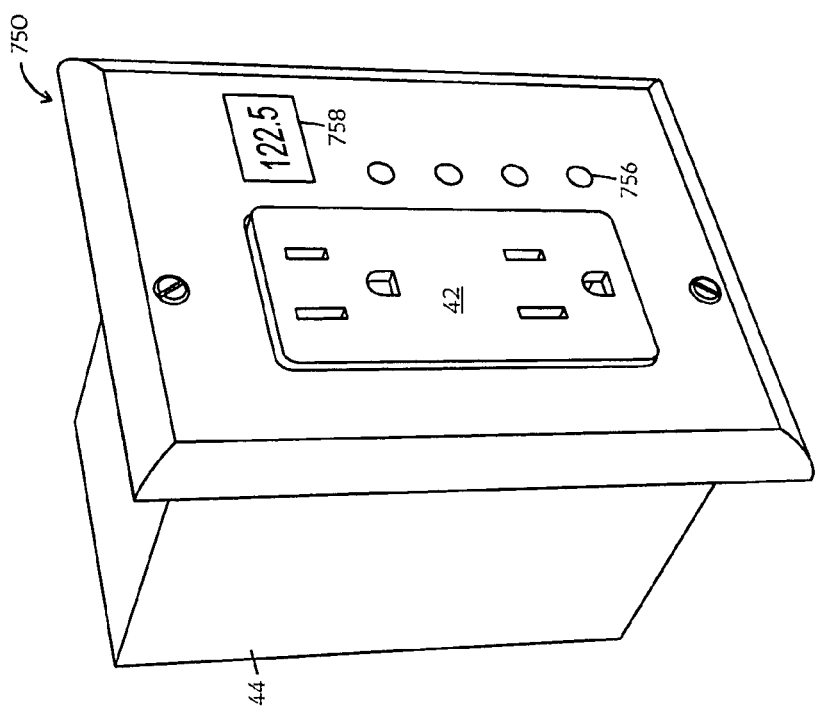
FIG. 15A is an isometric view of an embodiment of a cover plate subassembly of the invention.

One exemplary device, a cover plate subassembly 750, is disclosed in FIGS. 15A and 15B. The cover plate subassembly 750 preferably includes the detector 10 or the detector 210 (not shown) as preferred. As can be seen in FIGS. 15A and 15B, the cover plate subassembly 750 preferably includes a body 752 with an aperture 754 therein. The cover plate subassembly 750 is intended for use with an existing prior art receptacle 42 positioned in an existing box 44, as is known. Preferably, the aperture 750 permits the cover plate subassembly body 752 to be positioned around the receptacle 42 so that a face portion 46 of the receptacle 42 is exposed, and accessible. The cover plate subassembly 750 preferably includes one or more LEDs (or other suitable lighting devices) 756 comprising means 726 for providing a visual signal, if a resistive fault condition is detected. Preferably, the LEDs also are adapted to indicate the status of the circuit otherwise, e.g., one LED may be illuminated if the status is "normal". It is also preferred that the subassembly 750 includes a display 758 which, as shown, indicates the voltage between the live and neutral conductors at the receptacle 42, substantially in real time. The cover plate subassembly 750 may also, if preferred, include means for providing an audible signal (not shown in FIGS. 15A and 15B) in the event that a resistive fault condition is detected.

Figure 16B:
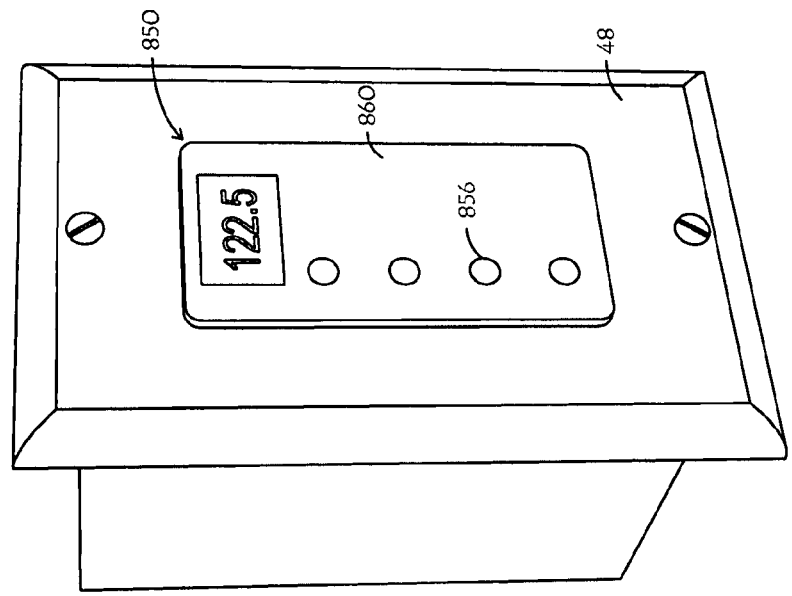
FIG. 16B is an isometric view of the resistive fault condition detector of FIG. 16A with a cover plate in position therearound.
Figure 16A:
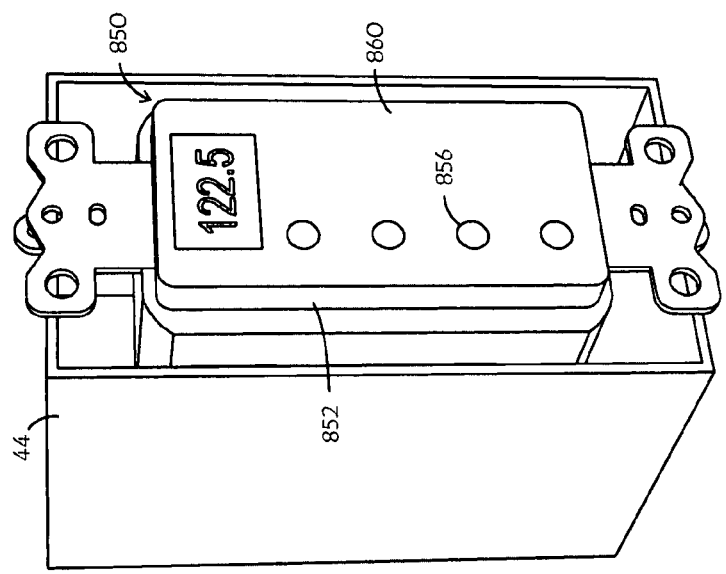
FIG. 16A is an isometric view of another embodiment of the resistive fault condition detector of the invention.
Figure 17B:
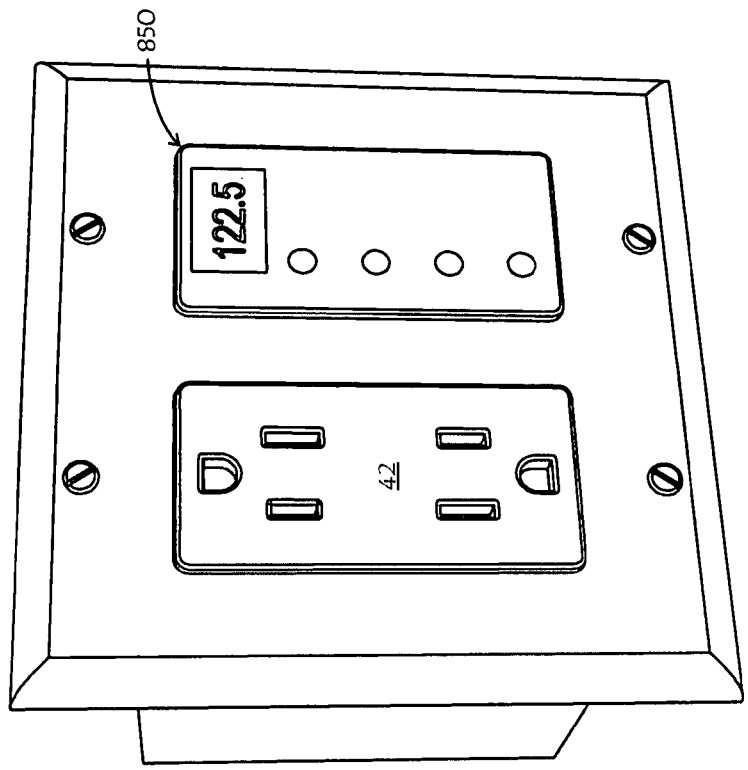
FIG. 17B is an isometric view of the resistive fault condition detector of FIG. 17A with a cover plate in position therearound.
Figure 17A:
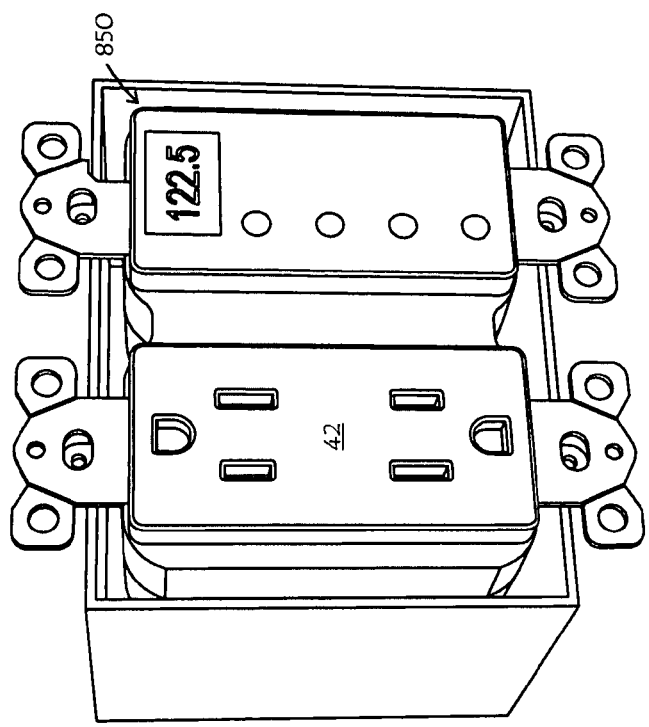
FIG. 17A is an isometric view of another embodiment of the resistive fault condition detector of the invention.

As another example, FIGS. 16A and 16B disclose a monitoring device 850 positionable in the prior art box 44. For convenience, the monitoring device 850 includes a body 852 with a face 860 which preferably resembles (in size and shape) the face portion of a conventional two-outlet receptacle. The body 852 of the monitoring device 850 is configured in this way so that a conventional cover plate 48 can be positioned on the monitoring device 850, to permit the face 860 to be exposed. As can be seen in FIGS. 16A and 16B, the monitoring device 850 preferably includes LEDs (or other suitable lighting devices 856) to indicate status (and in particular, a resistive fault condition) which are positioned in the face 860. Optionally, the monitoring device 850 preferably also includes a display 858 to show the voltage between the live and the neutral conductors in the circuit at the monitoring device 850. The monitoring device 850 optionally may include an audible alarm (not shown), and may also include a means for disconnecting the live conductor upon receipt of the alarm signal (not shown). FIGS. 17A and 17B disclose the monitoring device 850 positioned in a conventional box for dual receptacles.

Figure 6:
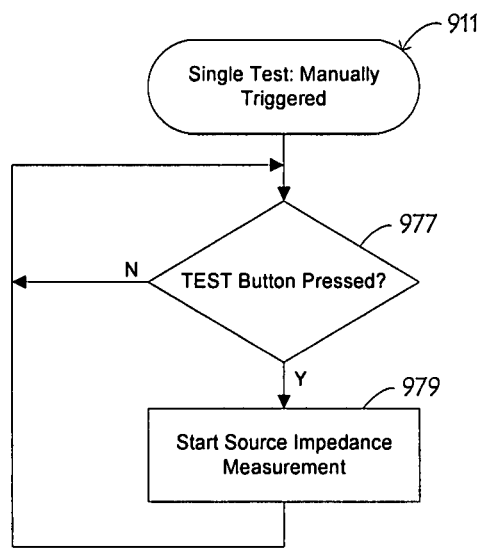
FIG. 6 is a flow chart schematically illustrating a portion of an embodiment of a method of the invention.

It will be appreciated by those skilled in the art that the testing procedure may be initiated in various ways. For example, in one embodiment, a detector 910 preferably includes a test button for manual initiation of a test which is accessible by a user (not shown). As can be seen in FIG. 6, upon the user pressing the test button (step 977), the testing (i.e., whether active or passive) commences (step 979).

Figure 7:
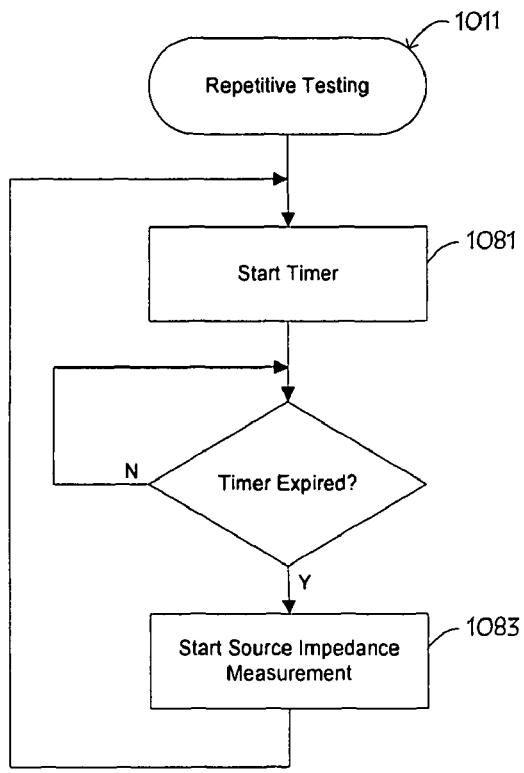
FIG. 7 is a flow chart schematically illustrating a portion of an embodiment of a method of the invention.

In another embodiment, the testing is conducted repetitively, according to the method 1011 disclosed in FIG. 7. Preferably, the active load is a resistor which is switched on for a period of time substantially equal to one cycle of the supply voltage. When repetitive testing is to be conducted, a delay between tests is necessary, to allow the resistor to cool. Accordingly, in the method 1011, the process preferably begins when a timer is started (step 1081), and the next testing to determine estimated source impedances is not commenced until the timer has expired (step 1083). It will be appreciated by those skilled in the art that the delay (if any) necessary for switched load cooling is dependent on the switched load impedance and the length of time that the load is switched on.

Figure 4:
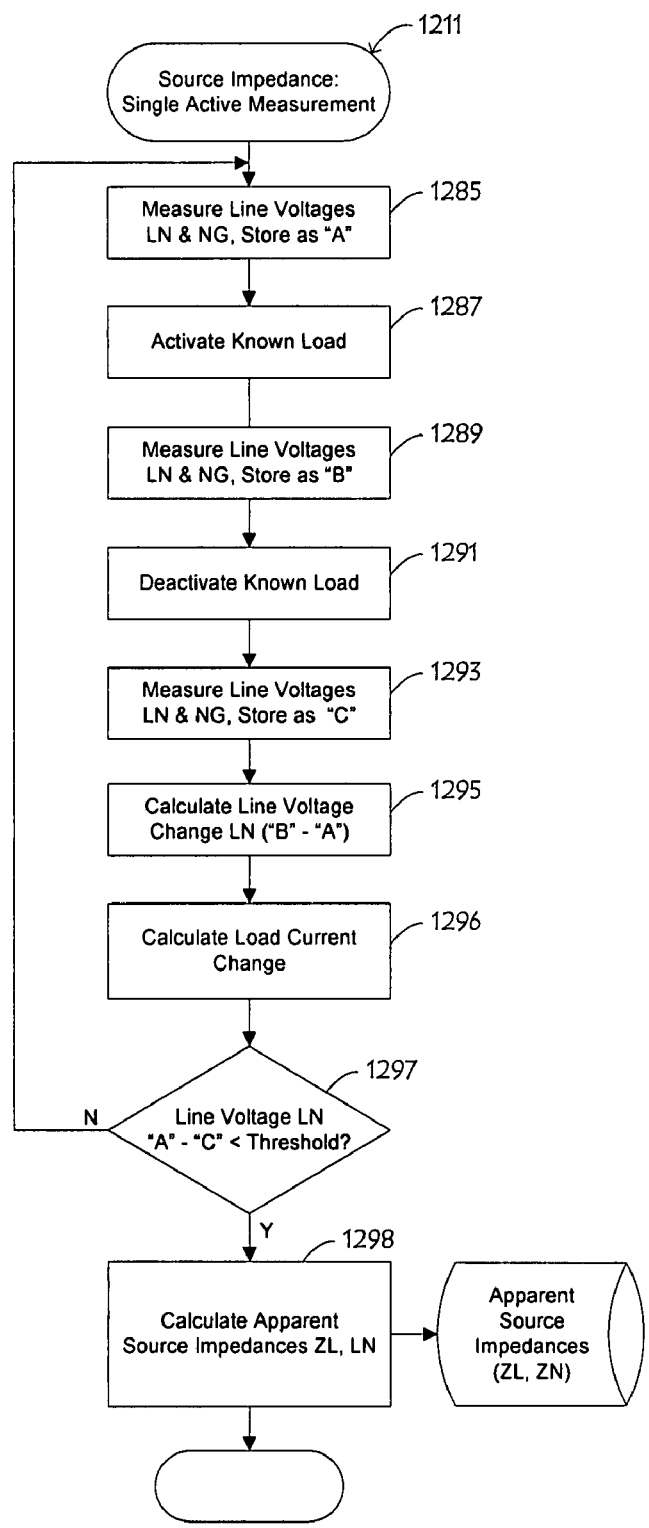
FIG. 4 is a flow chart schematically illustrating another embodiment of a method of the invention.

As shown in FIG. 4, a single test per measurement process may be conducted in a method 1211 of the invention disclosed therein. Preferably, the test is initiated by the user, e.g., via manual initiation means, in the method schematically illustrated in FIG. 6. The testing conducted according to the method 1211 is "active". After initiation, voltages are measured between the live and neutral conductors (LN) and between the neutral and ground conductors (NG), which data is stored and referred to for convenience as "A" (step 1285). Next, in step 1287, a known load is activated. In the next step, voltages between the live and the neutral conductors and between the neutral and the ground conductors are measured again, and such measured voltages are stored and referred to for convenience as "B" (step 1289). The known load is then deactivated (step 1291).

Next, it is preferred that voltages between the live and neutral conductors and between the neutral and ground conductors are measured again, and such voltages are stored and referred to for convenience as "C" (step 1293).

In step 1295, the voltage changes apparently resulting from activation of the known load are determined. In step 1296, changes in current are calculated, based on the measured change in voltage and the known characteristics of the load.

Preferably, LN voltage "A" is compared to LN voltage "C". If the difference between such voltages is less than a predetermined threshold voltage difference, then the method 1211 proceeds to the next step, as described below. If the difference between such voltages is greater than the threshold voltage difference, however, then the process (i.e., beginning with step 1285) is recommenced.

The steps 1293 and 1297 are preferred because they result in discarding measurements where line voltage changed due to effects other than the switched load. Those skilled in the art will appreciate that the method 1211 is workable without steps 1293 and 1297. However, in the absence of steps 1293 and 1297, the method 1211 would be more sensitive to interference. Accordingly, steps 1293 and 1297 are intended to ensure that the measured changes in voltage correspond largely to the changes in current in this method.

Next, apparent source impedances are calculated (step 1298). In the next step, the apparent source impedances for the live and neutral conductors respectively are used to calculate respective estimated source impedances (step 119), as schematically illustrated in FIG. 3.

The estimated source impedances resulting from the method 1211 may be compared to impedance threshold values to determine whether the estimated source impedances are below impedance threshold values, as schematically illustrated in FIG. 5, and as described above. Also as described above, the estimated source impedances resulting from the method 1211 may be used to determine an imbalance, and such imbalance can be compared to an imbalance threshold value to determine whether the imbalance is below the imbalance threshold value, as schematically illustrated in FIG. 5.

Any element in a claim that does not explicitly state "means for" performing a specific function, or "step for" performing a specific function, is not to be interpreted as a "means" or "step" clause as specified in 35 U.S.C. §112, par. 6.

It will be appreciated by those skilled in the art that the invention can take many forms, and that such forms are within the scope of the invention as claimed. Therefore, the spirit and scope of the appended claims should not be limited to the descriptions of the preferred versions contained herein.

We claim:

1. A resistive fault condition detector for conducting at least one test of a circuit comprising a live conductor, a neutral conductor, a ground conductor, and a load, the detector comprising:
    means for determining changes in current through the load during said at least one test;
    means for measuring changes in first and second voltages respectively between the live and neutral conductors and between the neutral and ground conductors during said at least one test, said changes in said first and second voltages corresponding to said changes in said current respectively;
    means for calculating sets of apparent source impedances for the live and neutral conductors respectively based on said changes in said current and said corresponding measured changes in said first and second voltages respectively;
    means for calculating an estimated source impedance for each of said live and neutral conductors respectively for said at least one test, the estimated source impedances for the live and neutral conductors respectively for each said set being deemed to be equal to the modes thereof if a proportion of the apparent source impedances matching the mode in each said respective set is greater than a predetermined proportion, each said set in which the proportion of the apparent source impedances matching the mode is less than the predetermined proportion being discarded;
    means for determining if any of the respective estimated source impedances for the live conductor and the neutral conductor exceeds a respective predetermined threshold value therefor, wherein at least one resistive fault condition in the circuit is detected if one of the predetermined threshold values is exceeded;
    means for generating an alarm signal upon detection of said at least one resistive fault condition; and
    means for disconnecting the live conductor upon receipt thereby of the alarm signal.

2. A resistive fault condition detector according to claim 1 which is adapted for temporary connection to the circuit.

3. A resistive fault condition detector according to claim 1 which is adapted for permanent connection to the circuit.

4. A resistive fault condition detector according to claim 1 additionally comprising means for determining an imbalance between the respective estimated source impedances for the live and neutral conductors.

5. A resistive fault condition detector according to claim 4 additionally comprising means for generating an alarm signal if the imbalance exceeds a predetermined imbalance threshold value.

6. A resistive fault condition detector according to claim 5 which is adapted for temporary connection to the circuit.

7. A resistive fault condition detector according to claim 5 which is adapted for permanent connection to the circuit.

8. A resistive fault condition detector according to claim 5 in which said predetermined imbalance threshold value is variable.

9. A resistive fault condition detector according to claim 5 in which the predetermined imbalance threshold value is based on a predetermined imbalance between the respective estimated source impedances for the live and neutral conductors.

10. A resistive fault condition detector according to claim 5 additionally comprising means for receiving the alarm signal and means for indicating detection of a resistive fault condition upon receipt of the alarm signal.

11. A resistive fault condition detector according to claim 5 additionally comprising means for receiving the alarm signal and means for disconnecting the live conductor upon receipt of the alarm signal.

12. A resistive fault condition detector according to claim 1 in which said changes in said current are determined by measurement of said current.

13. A resistive fault condition detector according to claim 12 in which the circuit is repeatedly tested.

14. A resistive fault condition detector according to claim 1 in which an additional load is connected to the circuit during said at least one test to produce said changes in said current.

15. A resistive fault condition detector according to claim 14 in which the additional load has known characteristics and said changes in said current are determined by calculation based on the known characteristics of the load.

16. A resistive fault condition detector according to claim 14 in which the circuit is repeatedly tested.

17. A resistive fault condition detector according to claim 1 in which each of said respective predetermined threshold values is variable.

18. A resistive fault condition detector according to claim 1 in which each of said respective predetermined threshold values is based on a predetermined impedance for each of the live and neutral conductors respectively.

19. A resistive fault condition detector according to claim 1 additionally comprising a means for initiating said at least one test.

20. A resistive fault condition detector according to claim 1 in which said respective predetermined threshold values for the respective estimated source impedances are automatically configured by applying predetermined margins to said apparent source impedances for the live and neutral conductors respectively.

21. A method for conducting at least one test of a circuit comprising a live conductor, a neutral conductor, a ground conductor, and a load, the method comprising:
   (a) determining changes in current through the load during said at least one test;
   (b) measuring changes in first and second voltages respectively between the live and neutral conductors and between the neutral and ground conductors during said at least one test, said changes in said first and second voltages corresponding to said changes in said current respectively;
   (c) calculating sets of apparent source impedances for the live and neutral conductors respectively based on said changes in said current and said measured changes in said first and second voltages respectively;
   (d) calculating an estimated source impedance for each of said live and neutral conductors respectively for said at least one test by calculating modes for the live and neutral conductors respectively in each said set and comparing the apparent source impedances in each said set respectively to the modes thereof respectively, the estimated source impedances for the live and neutral conductors respectively of each said set being deemed to be equal to the modes thereof if a proportion of the apparent source impedances for the live and neutral conductors respectively of each said respective set matching the mode thereof is greater than a predetermined proportion, each said set in which the proportion of the apparent source impedances matching the mode is less than the predetermined proportion being discarded;
   (e) determining if any of the respective estimated source impedances for the live conductor and the neutral conductor exceeds a respective predetermined threshold value therefor, wherein at least one resistive fault condition is detected if any one of said predetermined threshold values is exceeded;
   (f) generating an alarm signal upon detection of said at least one resistive fault condition; and
   (g) disconnecting the live conductor upon generation of the alarm signal.

22. A method according to claim 21 in which said changes in said current are determined by measurement of said current.

23. A method according to claim 21 additionally comprising a step of connecting the load during said at least one test to produce said changes in current.

24. A method according to claim 23 in which the load has known characteristics and said changes in said current are determined by calculation thereof.

25. A method according to claim 21 in which at least one of said respective predetermined threshold values for the respective estimated source impedances is set based on at least one selected characteristic of the circuit.

26. A method according to claim 21 in which said respective predetermined threshold values for the respective estimated source impedances are automatically configured by applying predetermined margins to said apparent source impedances for the live and neutral conductors respectively.

27. A method for conducting at least one test of a circuit comprising a live conductor, a neutral conductor, a ground conductor, and a load, the method comprising:
   (a) determining changes in current through the load during said at least one test;
   (b) measuring changes in first and second voltages respectively between the live and neutral conductors and between the neutral and ground conductors during said at least one test, said changes in said first and second voltages corresponding to said changes in said current respectively;
   (c) calculating sets of apparent source impedances for the live and neutral conductors respectively based on said changes in said current and said measured changes in said first and second voltages respectively, each said set comprising said apparent source impedances for the live and neutral conductors respectively calculated based on each said respective change in current and said measured changes in each of said first and second voltages corresponding thereto;
   (d) calculating an estimated source impedance for each of said live and neutral conductors respectively for said at least one test by calculating modes for the live and neutral conductors respectively in each said set and comparing the apparent source impedances for the live and neutral conductors respectively in each said set respectively to the modes thereof respectively, the estimated source impedances for the live and neutral conductors respectively in each said set being deemed to be equal to the modes thereof if a proportion of the apparent source impedances in each said set matching the mode thereof is greater than a predetermined proportion, each said set in which the proportion of the apparent source impedances matching the mode is less than the predetermined proportion being discarded;
   (e) determining whether there is an imbalance between the respective estimated source impedances in each said set for the live and neutral conductors; and
   (f) if said imbalance is found, determining if the imbalance between the respective estimated source impedances in each said set exceeds a predetermined imbalance threshold value therefor, wherein at least one resistive fault condition is detected if any of the predetermined imbalance threshold values is exceeded; and
   (g) generating an alarm signal upon detection of said at least one resistive fault condition.

28. A method according to claim 27 in which said predetermined imbalance threshold value is set based on at least one selected characteristic of the circuit.

29. A method according to claim 27 in which said respective predetermined imbalance threshold value is automatically configured by applying a predetermined margin to said apparent source impedance for at least one of the live and neutral conductors respectively.

30. A resistive fault condition detector for conducting at least one test of a circuit comprising a live conductor, a neutral conductor, a ground conductor, and a load, the detector comprising:

means for initiating said at least one test;

means for determining changes in current through the load during said at least one test;

means for measuring changes in first and second voltages respectively between the live and neutral conductors and between the neutral and ground conductors during said at least one test, said changes in each of said first and second voltages corresponding to said changes in said current respectively;

means for calculating sets of apparent source impedances for the live and neutral conductors respectively based on said changes in said current and said corresponding measured changes in said first and second voltages respectively;

means for calculating an estimated source impedance for each of said live and neutral conductors respectively for said at least one test, the estimated source impedances for the live and neutral conductors respectively in each said set being deemed to be equal to the modes thereof if a proportion of the apparent source impedances matching the mode in each said respective set is greater than a predetermined proportion, each said set in which the proportion of the apparent source impedances matching the mode is less than the predetermined proportion being discarded;

means for setting respective predetermined threshold values for said estimated source impedances for each of said live and neutral conductors respectively based on at least one characteristic of the circuit;

means for determining if any one of the respective estimated source impedances for the live conductor and the neutral conductor exceeds said respective predetermined threshold value therefor, wherein at least one resistive fault condition is detected if any one of the predetermined threshold values is exceeded;

means for generating an alarm signal upon detection of said at least one resistive fault condition; and means for disconnecting the live conductor upon receipt thereby of the alarm signal.

31. A resistive fault condition detector for conducting at least one test of a circuit comprising a live conductor, a neutral conductor, a ground conductor, and a load, the detector comprising:

means for initiating said at least one test;

means for determining changes in current through the load during said at least one test;

means for measuring changes in first and second voltages respectively between the live and neutral conductors and between the neutral and ground conductors during said at least one test, said changes in each of said first and second voltages corresponding to said changes in said current respectively;

means for calculating sets of apparent source impedances for each of the live and neutral conductors respectively based on each of said changes in said current and said corresponding measured changes in each of said first and second voltages respectively, each said set comprising said apparent source impedances for the live and neutral conductors respectively calculated based on each said respective change in current and said measured changes in each of said first and second voltages corresponding thereto;

means for calculating an estimated source impedance for each of said live and neutral conductors respectively for said at least one test, the estimated source impedances for the live and neutral conductors respectively in each said set being deemed to be equal to the modes thereof if a proportion of the apparent source impedances matching the modes for the live and neutral conductors respectively in each said respective set is greater than a predetermined proportion, each said set in which the proportion of the apparent source impedances matching the mode is less than the predetermined proportion being discarded;

means for determining whether there is an imbalance between the respective estimated source impedances in each said set for the live and neutral conductors;

means for determining whether, if said imbalance is found, the imbalance between the respective estimated source impedances in each said set exceeds a predetermined imbalance threshold value between the respective estimated source impedances for the live and neutral conductors, wherein at least one resistive fault condition is detected if the predetermined imbalance threshold value is exceeded;

means for generating an alarm signal upon detection of said at least one resistive fault condition; and means for disconnecting the live conductor upon receipt thereby of the alarm signal.

32. A resistive fault condition detector according to claim 31 in which said predetermined imbalance threshold value is set based on at least one selected characteristic of the circuit.

33. A resistive fault condition detector according to claim 31 in which said predetermined imbalance threshold value is automatically configured by applying a predetermined margin to said apparent source impedance for at least one of the live and neutral conductors respectively.

* * * * *